US012765378B2

(12) United States Patent
Wakabayashi et al.

(10) Patent No.: US 12,765,378 B2
(45) Date of Patent: Oct. 13, 2026

(54) SEMICONDUCTOR APPARATUS

(71) Applicant: SONY SEMICONDUCTOR SOLUTIONS CORPORATION, Kanagawa (JP)

(72) Inventors: Takahiro Wakabayashi, Kumamoto (JP); Yoichiro Fujinaga, Kanagawa (JP); Kenichi Taguchi, Kumamoto (JP); Seiya Tsuzaki, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 202 days.

(21) Appl. No.: 18/717,571

(22) PCT Filed: Dec. 1, 2022

(86) PCT No.: PCT/JP2022/044327

§ 371 (c)(1),
(2) Date: Jun. 7, 2024

(87) PCT Pub. No.: WO2023/112691

PCT Pub. Date: Jun. 22, 2023

(65) Prior Publication Data

US 2025/0054834 A1 Feb. 13, 2025

(30) Foreign Application Priority Data

Dec. 15, 2021 (JP) ................................ 2021-203020

(51) Int. Cl.
*H01L 23/38* (2006.01)
*H10F 39/00* (2025.01)
*H10W 40/28* (2026.01)

(52) U.S. Cl.
CPC .......... *H10W 40/28* (2026.01); *H10F 39/804* (2025.01); *H10F 39/811* (2025.01)

(58) Field of Classification Search
None
See application file for complete search history.

(56) References Cited

U.S. PATENT DOCUMENTS 12,406,900 B2 * 9/2025 Nakayama ............ H10W 40/28
2009/0309239 A1 * 12/2009 Nishimura ............ H10W 70/68
257/778

(Continued)

FOREIGN PATENT DOCUMENTS

JP H04-121750 10/1992
JP H06-216402 8/1994

(Continued)

OTHER PUBLICATIONS

English Translation of International Search Report prepared by the Japan Patent Office on Feb. 13, 2023, for International Application No. PCT/JP2022/044327, 3 pgs.

*Primary Examiner* — Long Pham
(74) *Attorney, Agent, or Firm* — SHERIDAN ROSS P.C.

(57) ABSTRACT

The present technology relates to a semiconductor apparatus that makes it possible to make a sensor-chip package smaller in size, where a Peltier element is arranged in the sensor-chip package. The semiconductor apparatus includes a package that includes a concave portion; a sensor chip that is arranged in the concave portion; and a Peltier element that is arranged between the sensor chip and the package. A back-surface terminal and an upper-surface terminal are electrically connected to each other through a conductive resin, the back-surface terminal being formed on a back surface of a lower substrate of the Peltier element, the upper-surface terminal being formed on an upper surface of the concave portion to face the back-surface terminal. The present technology is applicable to, for example, a semiconductor apparatus that includes a built-in SWIR image sensor.

31 Claims, 31 Drawing Sheets

(56) References Cited

U.S. PATENT DOCUMENTS

| | | | | |
|---|---|---|---|---|
| 2023/0022940 | A1* | 1/2023 | Taguchi | H10W 40/28 |
| 2024/0429253 | A1* | 12/2024 | Ogami | H10F 39/804 |
| 2025/0194292 | A1* | 6/2025 | Yasukawa | H10F 39/804 |

FOREIGN PATENT DOCUMENTS

| | | |
|---|---|---|
| JP | 2000-138393 | 5/2000 |
| JP | 2006-135659 | 5/2006 |
| JP | 2020-161763 | 10/2020 |
| WO | WO 2021/132184 | 7/2021 |

* cited by examiner

SEMICONDUCTOR APPARATUS

CROSS REFERENCE TO RELATED APPLICATIONS

This application is a national stage application under 35 U.S.C. 371 and claims the benefit of PCT Application No. PCT/JP2022/044327, having an international filing date of 1 Dec. 2022, which designated the United States, which PCT application claimed the benefit of Japanese Patent Application No. 2021-203020, filed 15 Dec. 2021, the entire disclosures of each of which are incorporated herein by reference.

TECHNICAL FIELD

The present technology relates to a semiconductor apparatus, and in particular, to a semiconductor apparatus that makes it possible to make a sensor-chip package smaller in size, where a Peltier element is arranged in the sensor-chip package.

BACKGROUND ART

A SWIR image sensor that is an image sensor using an infrared wavelength in a short wave infrared (SWIR) band is formed using a compound semiconductor. Thus, the SWIR image sensor has the property of increasing a dark current dependent on the temperature, compared with an image sensor formed using a silicon semiconductor. Thus, there is a need to provide a SWIR image sensor with a temperature control mechanism intended to prevent a dark current, that is, a cooling mechanism, in order to maintain the sensing performance.

Thus, a package that is used in a SWIR image sensor and includes a Peltier element has been devised, the package releasing heat generated by the SWIR image sensor to the outside using the Peltier element as the cooling mechanism. A lead winding method is used as a Peltier mounting method applied to such a package.

In the lead winding method, for example, a lead wire connected to a terminal of a Peltier element is connected to a terminal provided to a package, and the terminal provided to the package is electrically connected to an external terminal of the package. Accordingly, the Peltier element is mounted (for example, refer to Patent Literature 1). In this case, in order to mount a Peltier element, there is a need for a space used to pull a lead wire out of the terminal of the Peltier element and to provide a terminal to which the lead wire is connected (hereinafter referred to as a Peltier connection space), and for a relay substrate. Thus, there are structural restrictions due to a Peltier connection space and a space for arranging a relay substrate being ensured, and this results in difficulty in making the package smaller in size.

CITATION LIST

Patent Literature

Patent Literature 1: WO 2021/132184

DISCLOSURE OF INVENTION

Technical Problem

As described above, a package that is used for a chip of a sensor such as a SWIR image sensor and in which a Peltier element is arranged is desired to be made smaller in size. However, such a desire has not been sufficiently satisfied so far.

The present technology has been made in view of the circumstances described above, and it is an object of the present technology to make it possible to make a sensor-chip package smaller in size, where a Peltier element is arranged in the sensor-chip package.

Solution to Problem

A semiconductor apparatus according to an aspect of the present technology is a semiconductor apparatus that includes a package that includes a concave portion; a sensor chip that is arranged in the concave portion; and a Peltier element that is arranged between the sensor chip and the package, in which a back-surface terminal and an upper-surface terminal are electrically connected to each other through a conductive resin, the back-surface terminal being formed on a back surface of a lower substrate of the Peltier element, the upper-surface terminal being formed on an upper surface of the concave portion to face the back-surface terminal.

In an aspect of the present technology, a package that includes a concave portion; a sensor chip that is arranged in the concave portion; and a Peltier element that is arranged between the sensor chip and the package are provided, in which a back-surface terminal and an upper-surface terminal are electrically connected to each other through a conductive resin, the back-surface terminal being formed on a back surface of a lower substrate of the Peltier element, the upper-surface terminal being formed on an upper surface of the concave portion to face the back-surface terminal.

MODE(S) FOR CARRYING OUT THE INVENTION

Embodiments for carrying out the present technology (hereinafter referred to as "embodiments") will now be described below. Note that the description is made in the following order.

1. Embodiments of Semiconductor Apparatus
2. Example of Application to Electronic Apparatus
3. Example of How to Use Semiconductor Apparatus
4. Example of Application to Endoscopic Surgery System
5. Example of Application to Mobile Body Note that, in the figures referred to in the following description, the same or similar portions will be denoted by the same or similar reference symbols. However, the figures are schematic ones, and, for example, a relationship between the thickness and a planar dimension and a ratio of thicknesses of respective layers are respectively different from the actual ones. Further, a certain figure and another figure may have different dimensional relationships and different ratios of dimensions with respect to the same portion.

Further, the definition of a direction such as an upper side and a lower side in the following description is merely a definition used for convenience of description, and the technical idea of the present disclosure is not limited to such a definition. For example, the upper side and the lower side will be understood by respectively being changed to a right side and a left side if a target is watched after being rotated 90 degrees, and the upper side and the lower side will be understood by being turned upside down if the target is watched after being rotated by 180 degrees.

1. Embodiments of Semiconductor Apparatus

Example of Appearance Configuration of Semiconductor Apparatus

Figure 1:
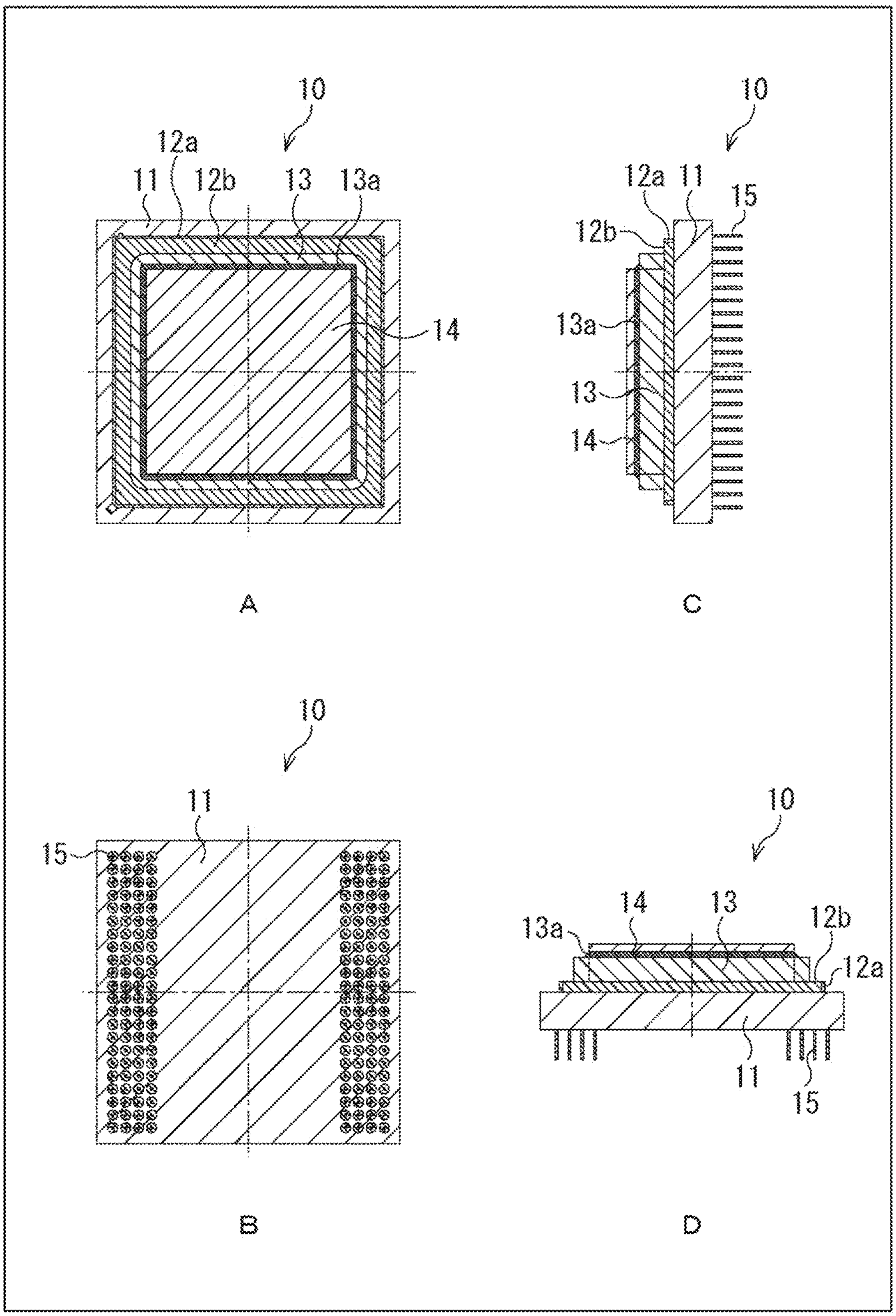
FIG. 1 illustrates an example of an appearance configuration of an embodiment of a semiconductor apparatus to which the present technology is applied.

FIG. 1 illustrates an example of an appearance configuration of an embodiment of a semiconductor apparatus to which the present technology is applied.

A of FIG. 1 is a top view of a semiconductor apparatus 10, and B of FIG. 1 illustrates a back surface (a lower surface) of the semiconductor apparatus 10. C of FIG. 1 is a side view of the semiconductor apparatus 10 as viewed from a right side of the semiconductor apparatus 10 illustrated in A or B of FIG. 1, and D of FIG. 1 is a side view of the semiconductor apparatus 10 as viewed from a lower side of the semiconductor apparatus 10 illustrated in A or B of FIG. 1.

The semiconductor apparatus 10 includes a built-in sensor chip of a SWIR image sensor such as an InGaAs image sensor (not illustrated) and has a packaging structure in which the interior of a package is hermetically sealed. Specifically, in the semiconductor apparatus 10, a metallic ring 12*a*, a metallic lid 12*b*, a ceramic lid 13, a low melting glass 13*a*, and a glass substrate 14 are arranged on a package (a package structure) 11 in this order to seal the package 11, as illustrated in A to D of FIG. 1, where a sensor chip (not illustrated) is arranged in the package.

The package 11 and the ceramic lid 13 are made of, for example, a material that includes ceramics. A metallic ring 12*a* and a metallic lid 12*b* are made of a material that includes, for example, Kovar. The glass substrate 14 is made of, for example, borosilicate glass. The package 11, the metallic ring 12*a*, the metallic lid 12*b*, the ceramic lid 13, the low melting glass 13*a*, and the glass substrate 14 have larger length-and-width sizes in this order. In other words, the package 11, metallic ring 12*a*, metallic lid 12*b*, ceramic lid 13, low melting glass 13*a*, and glass substrate 14 being arranged at higher levels have smaller length-and-width sizes.

As illustrated in B to D of FIG. 1, a plurality of pin terminals 15 (with 22 rows×4 columns in the example illustrated in FIG. 1) is formed on each of left and right end portions on a back surface of the package 11 in B of FIG. 1. The pin terminal 15 is made of a conductive material such as metal, and has a substantially cylindrical shape. One of two ends of the pin terminal 15 is electrically and mechanically connected to a wiring layer that is exposed through the back surface of the package 11, and the pin terminal 15 extends downward from the back surface. The pin terminal 15 is formed such that, for example, pitch spacing is narrower than usual due to pitch shrinkage, in order to make the semiconductor apparatus 10 smaller in size.

<Configuration of Interior of Package>

Figure 2:
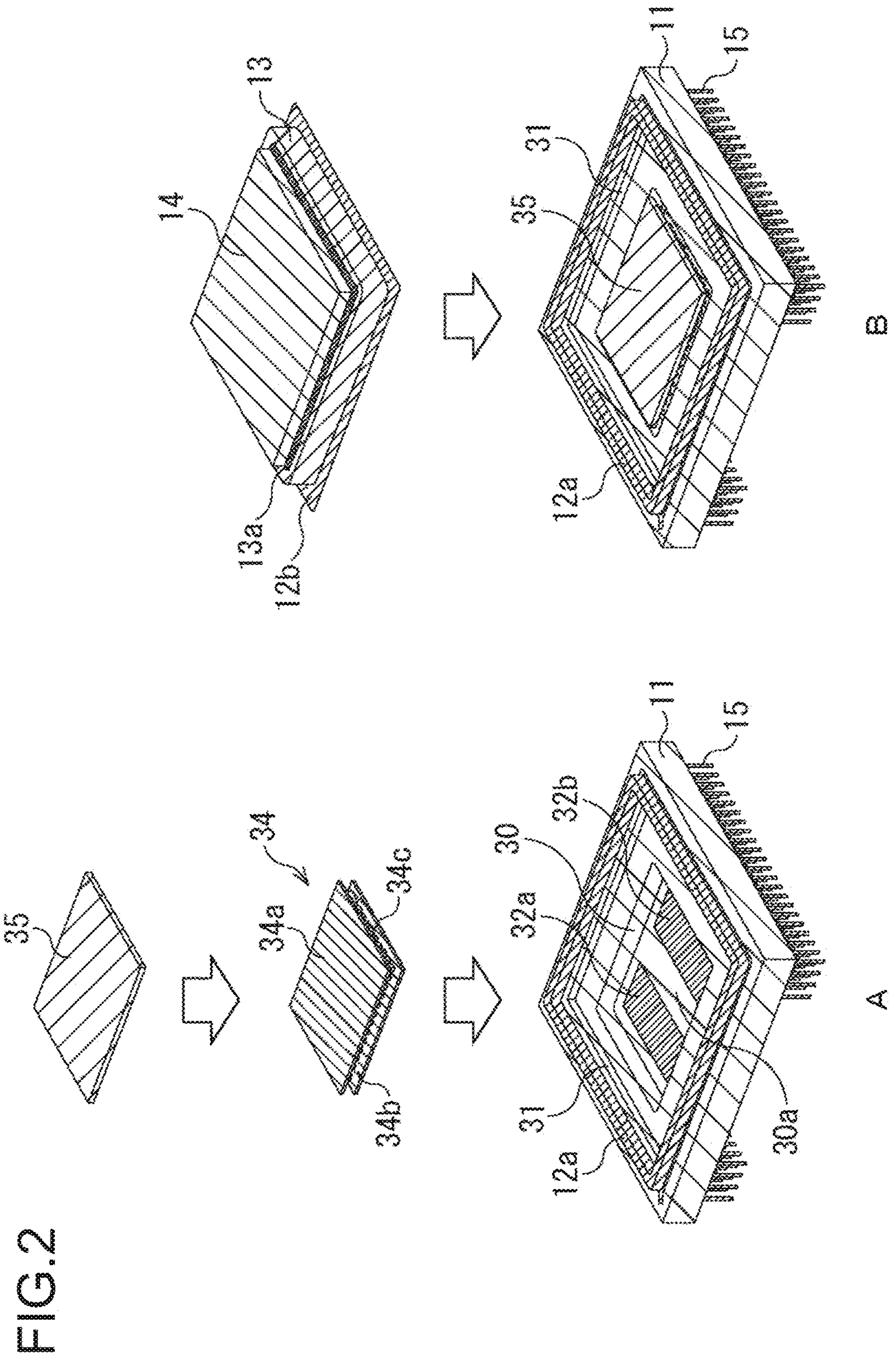
FIG. 2 is a set of perspective views each illustrating an overview of a configuration of the interior of a package illustrated in FIG. 1.

FIG. 2 is a perspective view illustrating an overview of a configuration of the interior of the package 11 illustrated in FIG. 1.

As illustrated in A of FIG. 2, the package 11 includes a concave portion 30 in a center portion of the package 11. The metallic ring 12*a* arranged on the package 11 includes an opening 31 in a center portion of the metallic ring 12*a*. An upper surface 30*a* of the concave portion 30 has a smaller length-and-width size than the opening 31. Upper-surface terminals 32*a* and 32*b* that include metal are provided to the upper surface 30*a* of the concave portion 30. A Peltier element 34 is arranged on the upper surface 30*a* of the concave portion 30.

The Peltier element 34 is formed by a pole portion 34*c* being arranged between an upper substrate 34*a* and a lower substrate 34*b*. The upper substrate 34*a* is a cooling substrate that includes a back surface on which the pole portion 34*c* is arranged, where a metallic layer (not illustrated) formed using a thin copper film is formed on the back surface. The lower substrate 34*b* is a heat releasing substrate that includes an upper surface on which the pole portion 34*c* is arranged, where a metallic layer (not illustrated) formed using a thin copper film is formed on the upper surface.

The pole portion 34*c* includes a pole-shaped p-type thermoelectric semiconductor and a pole-shaped n-type thermoelectric semiconductor. One of two ends of the p-type thermoelectric semiconductor and one of two ends of the n-type thermoelectric semiconductor are each connected to the metallic layer of the upper substrate 34*a*, and another of the two ends of the p-type thermoelectric semiconductor and another of the two ends of the n-type thermoelectric semiconductor are each connected to the metallic layer of the lower substrate 34*b*. Further, the p-type thermoelectric semiconductor and the n-type thermoelectric semiconductor are alternately connected in series with each other through the metallic layer of the upper substrate 34*a* and the metallic layer of the lower substrate 34*b*. In other words, the pole portion 34*c* has a daisy structure. Two ends of the pole portion 34*c* of which the p-type thermoelectric semiconductor and the n-type thermoelectric semiconductor are connected in series with each other, are respectively connected to different electrodes.

The Peltier element 34 has the above-described configuration. Accordingly, when direct current flows into the p-type thermoelectric semiconductor from the n-type thermoelectric semiconductor, the Peltier element 34 cools the interior of the semiconductor apparatus 10 by absorbing heat from an upper surface of the upper substrate 34*a*, and releases the absorbed heat through a back surface of the lower substrate 34*b*.

A sensor chip 35 of a SWIR image sensor is arranged on the Peltier element 34 in the concave portion 30. In other words, the Peltier element 34 is arranged between the sensor chip 35 and the package 11.

As illustrated in B of FIG. 2, the metallic lid 12*b*, the ceramic lid 13, the low melting glass 13*a*, and the glass substrate 14 are integrated with each other and arranged on the metallic ring 12*a* on the package 11 having the above-described configuration.

Figure 3:
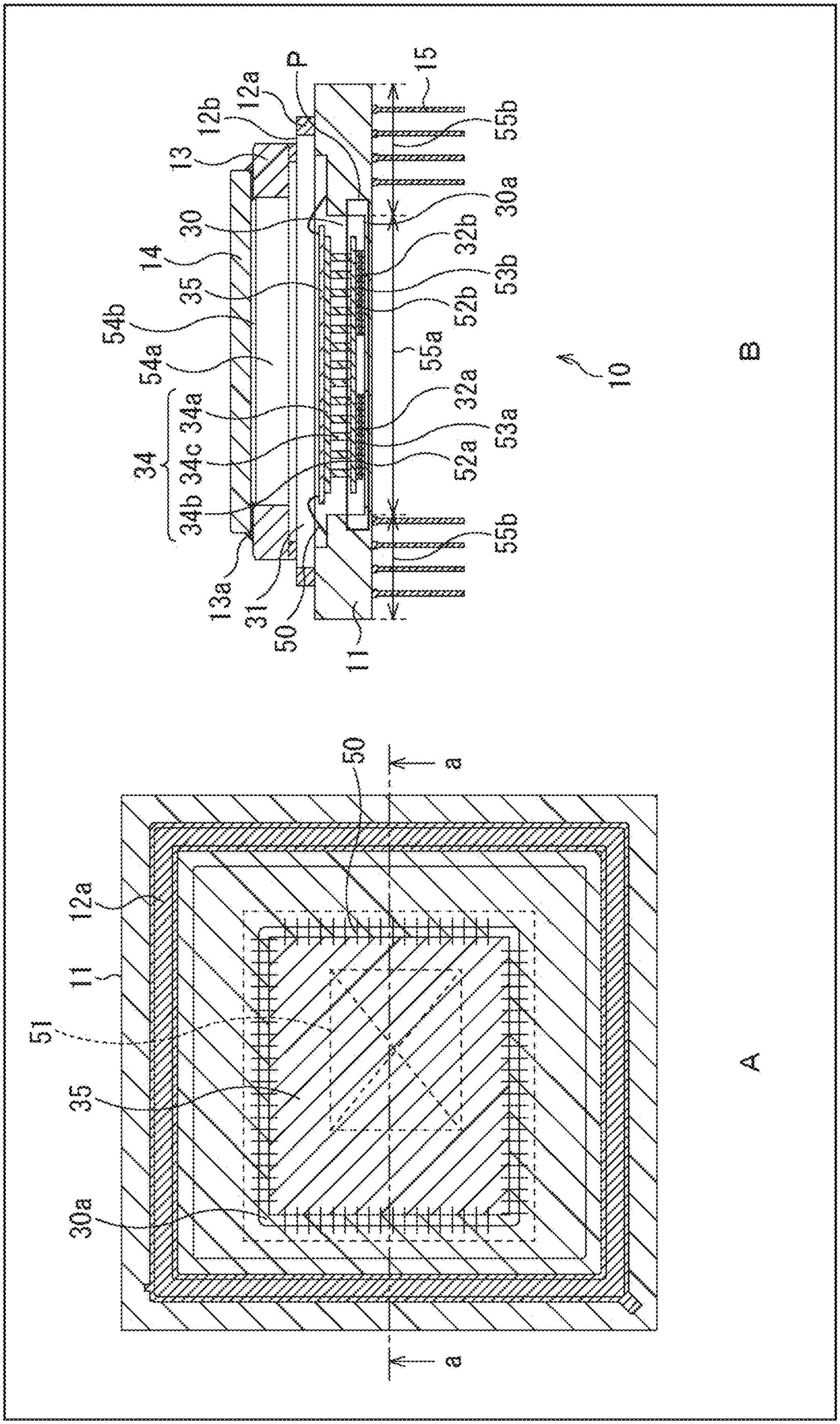
FIG. 3 is a set of a top view and a cross-sectional view of the semiconductor apparatus.

A of FIG. 3 is a top view of the semiconductor apparatus 10 as viewed from above, and B of FIG. 3 is a cross-sectional view of the semiconductor apparatus 10 along the line a-a illustrated in A of FIG. 3. Note that, in A of FIG. 3, a portion that is situated above the metallic ring 12*a* is not illustrated in order to make the interior of the semiconductor apparatus 10 more visible.

As illustrated in A and B of FIG. 3, the sensor chip 35 and the package 11 are electrically connected to each other through a wire 50. Here, an arrangement surface (a horizontal surface) of the Peltier element 34 has a larger length-and-width size than a light-receiving surface 51 of the sensor chip 35 that is illustrated in a see-through state in A of FIG. 3, but has a smaller length-and-width size than an arrangement surface (a horizontal surface) of the sensor chip 35. In other words, the sensor chip 35 overhangs the Peltier element 34, as illustrated in B of FIG. 3. Thus, the package 11 is made smaller in size according to the size of the sensor chip 35, and this makes it possible to make a distance between the sensor chip 35 and the package 11 smaller. This results in shortening the wire 50, and thus in being able to reduce the resistance of the wire 50.

On the back surface of the lower substrate 34*b* of the Peltier element 34, a back-surface terminal 52*a* is formed to face an upper-surface terminal 32*a*, and a back-surface terminal 52*b* is formed to face an upper-surface terminal 32*b*. The back-surface terminal 52*a* and the upper-surface terminal 32*a* are electrically connected to each other through a conductive resin 53*a*, and the back-surface terminal 52*b* and the upper-surface terminal 32*b* are electrically connected to each other through a conductive resin 53*b*. The back-surface terminals 52*a* and 52*b* include metal.

For example, a silver paste that is more thermally conductive than solder is favorably used as a material of the conductive resins 53*a* and 53*b*. When a more thermally conductive material than solder is used as a material of the conductive resins 53*a* and 53*b*, a larger amount of heat released through the back surface of the lower substrate 34*b* can be released to the outside of the package 11, compared to when a Peltier element is mounted using a back-surface soldering connection method that is electrically connecting a terminal formed on a back surface of a lower substrate of the Peltier element and a package that includes an external terminal. This makes it possible improve an effect of cooling the interior of the package 11.

Favorably, the conductive resins 53*a* and 53*b* each have a thickness of less than or equal to 100 μm in order to reduce the resistance. The thicknesses of the conductive resins 53*a* and 53*b* can be controlled. However, the thickness of solder is not controlled when the Peltier element is mounted using the back-surface soldering connection method. Thus, it is difficult to reduce the resistance in this case.

The ceramic lid 13 includes an opening 54*a*, and the low melting glass 13*a* includes an opening 54*b*. The opening 54*a* and the opening 54*b* each have a larger length-and-width size than the light-receiving surface 51 of the sensor chip 35.

Thus, the sensor chip 35 can receive light that enters through the glass substrate 14, and can convert the received light into an electric signal.

The glass substrate 14 seals the package 11 to provide hermetic sealing. This makes it possible to prevent water condensation from being generated in the package 11 by a cooling function of the Peltier element 34.

A region in which the pin terminal 15 is formed is a region 55*b* on the back surface of the package 11 that is other than a region 55*a* on the back surface of the package 11 that faces a region on the upper surface 30*a* of the concave portion 30 of the package 11, where the Peltier element 34 is arranged in the region on the upper surface 30*a*. In other words, the region being situated on the upper surface 30*a* and in which the Peltier element 34 is arranged, and the region 55*b* in which the pin terminal 15 is formed do not overlap in the plan view.

Figure 4:
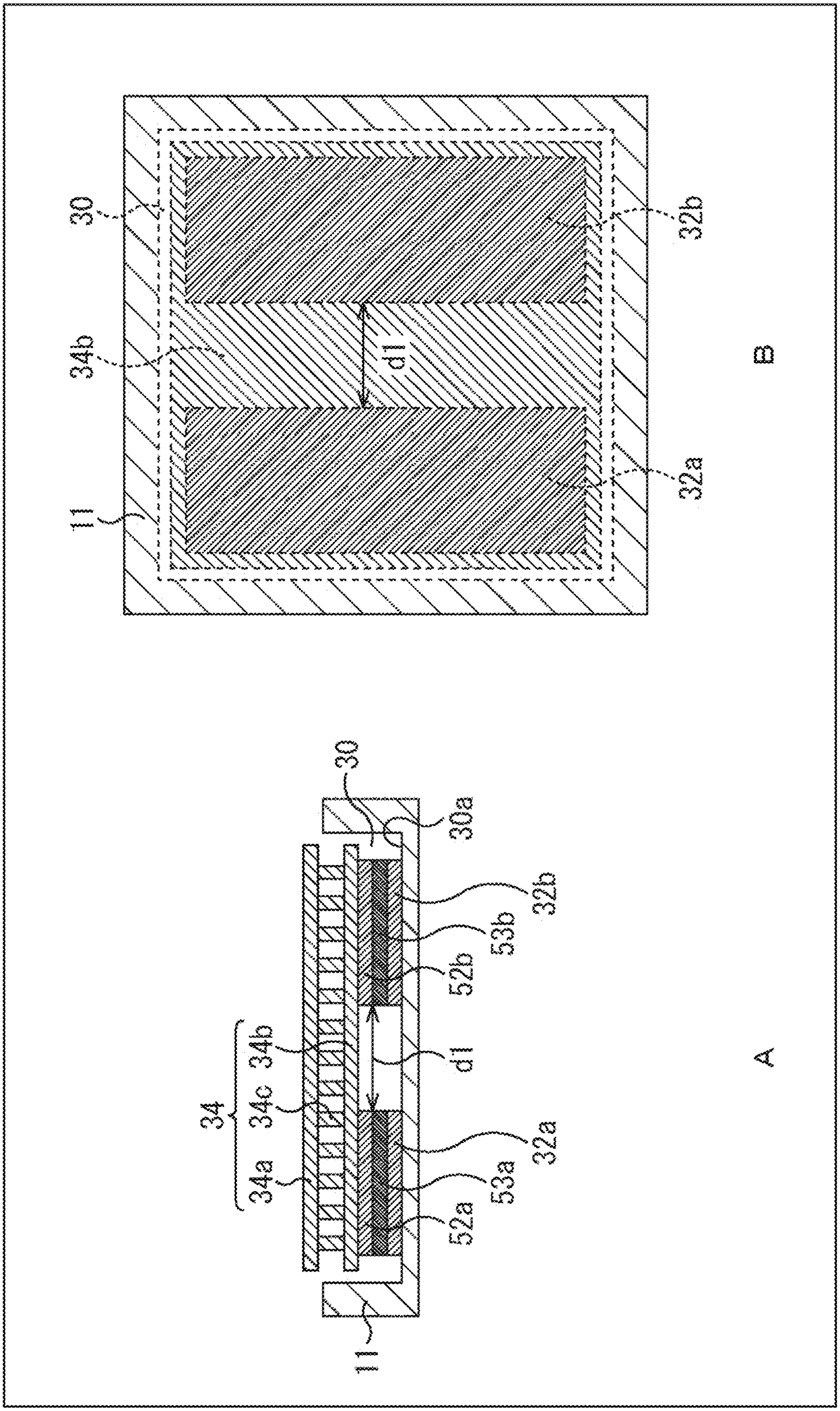
FIG. 4 is a set of an enlarged view of a rectangle illustrated in FIG. 3 and a diagram illustrating a back surface of the rectangle illustrated in FIG. 3.

A of FIG. 4 is an enlarged view of a rectangle P illustrated in FIG. 3, and B of FIG. 4 illustrates the rectangle P illustrated in FIG. 3 as viewed from the back surface of the package 11. B of FIG. 4 illustrates the interior of the package 11 in a see-through state.

As illustrated in A and B of FIG. 4, the upper-surface terminals 32*a* and 32*b* are formed to have the same length-and-width size in the same layer, and are situated at a specified distance d1 from each other. Likewise, the back-surface terminals 52*a* and 52*b* are formed to have the same length-and-width size in the same layer, and are situated at the specified distance d1 from each other. The conductive resins 53*a* and 53*b* are formed to have the same length-and-width size in the same layer, and are situated at the specified distance d1 from each other. The upper-surface terminals 32*a* and 32*b*, the back-surface terminals 52*a* and 52*b*, and the conductive resins 53*a* and 53*b* each have the same length-and-width size.

When the upper-surface terminals 32*a* and 32*b* are formed in the same layer, this enables both of the upper-surface terminals 32*a* and 32*b* to be formed at the same time. The same applies to the back-surface terminals 52*a* and 52*b* as well as the conductive resins 53*a* and 53*b*.

Detailed Description of Back-Surface Terminal

Figure 5:
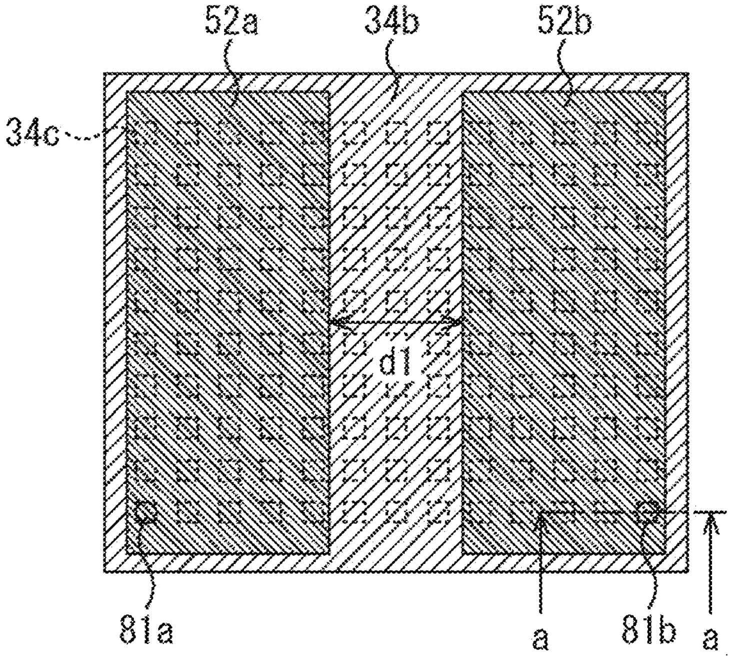
FIG. 5 illustrates a back surface of a lower substrate.
Figure 6:
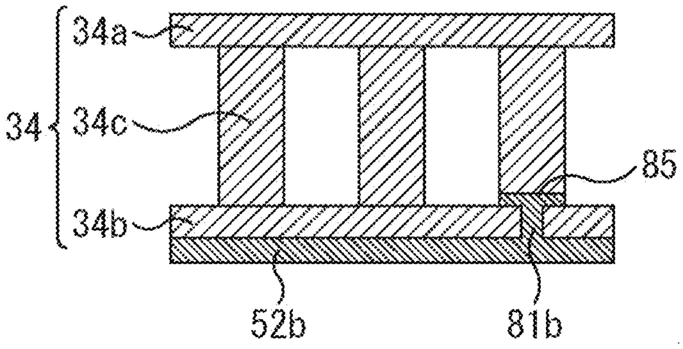
FIG. 6 is a cross-sectional view along the line a-a illustrated in FIG. 5.

FIG. 5 is a plan view of the lower substrate 34*b* as viewed from the back (below) that is used to describe, in detail, the back-surface terminals 52*a* and 52*b* formed on the back surface of the lower substrate 34*b* of the Peltier element 34. Note that FIG. 5 illustrates the pole portion 34*c* of the Peltier element 34 in a see-through state. FIG. 6 is a cross-sectional view along the line a-a illustrated in FIG. 5.

The back-surface terminal 52*a* is a positive terminal, and the back-surface terminal 52*b* is a negative terminal. In the back surface of the lower substrate 34*b*, the lower substrate 34*b* includes a via 81*a* illustrated on the lower left in FIG. 5, and a via 81*b* illustrated on the lower right in FIG. 5, as illustrated in FIG. 5. The via 81*a* overlaps the back-surface terminal 52*a* on the lower substrate 34*b*. Likewise, the via 81*b* overlaps the back-surface terminal 52*b* on the lower substrate 34*b*. In other words, the via 81*a* and the back-surface terminal 52*a* overlap in the plan view, and the via 81*b* and the back-surface terminal 52*b* overlap in the plan view.

As illustrated in FIG. 6, the via 81*b* passes through the lower substrate 34*b* to cause one end 85 of the pole portion 34*c* having a daisy structure and the back-surface terminal 52*b* to be electrically continuous with each other. The via 81*a* is formed similarly to the via 81*b*, although an illustration thereof is omitted. In other words, the via 81*a* passes through the lower substrate 34*b* to cause the other end of the pole portion 34*c* having a daisy structure and the back-surface terminal 52*a* to be electrically continuous with each other.

Detailed Description of Upper-Surface Terminal

Figure 7:
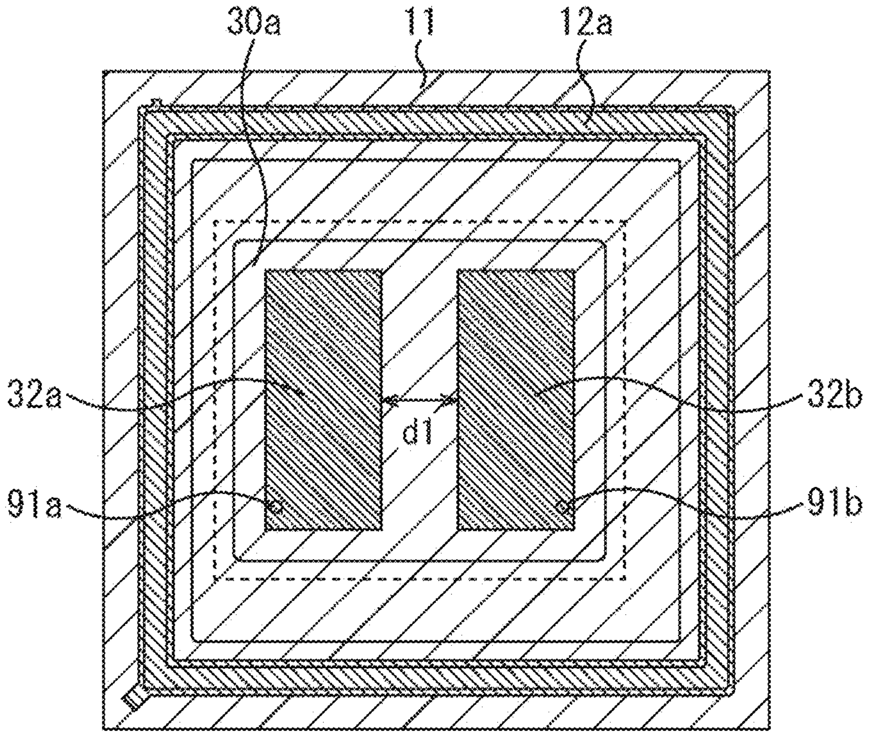
FIG. 7 is a top view of the package that is used to describe upper-surface terminals in detail.

FIG. 7 is a top view of the package 11 that is used to describe, in detail, the upper-surface terminals 32*a* and 32*b* formed on the upper surface 30*a* of the package 11, where the metallic ring 12*a* is arranged on the package 11 before the Peltier element 34 and the sensor chip 35 are arranged.

The upper-surface terminal 32*a* is a positive terminal, and the upper-surface terminal 32*b* is a negative terminal. In the upper surface 30*a* of the package 11, the package 11 includes a via 91*a* illustrated on the lower left in FIG. 7, and a via 91*b* illustrated on the lower right in FIG. 7, as illustrated in FIG. 7. The via 91*a* and the upper-surface terminal 32*a* overlap in the plan view, and the via 91*b* and the upper-surface terminal 32*b* overlap in the plan view.

Note that the upper-surface terminals 32*a* and 32*b* are favorably formed as large as possible to the extent that a short circuit is not caused between the upper-surface terminals 32*a* and 32*b*. When the upper-surface terminals 32*a* and 32*b* each have a large length-and-width size, the resistance can be reduced. Further, more excellent heat releasing properties can be obtained since a region in which heat released through the back surface of the lower substrate 34*b* of the Peltier element 34 is released to the outside of the package 11 is made larger. Furthermore, the strength can be secured.

<Description of Connection Made Through Vias>

Figure 8:
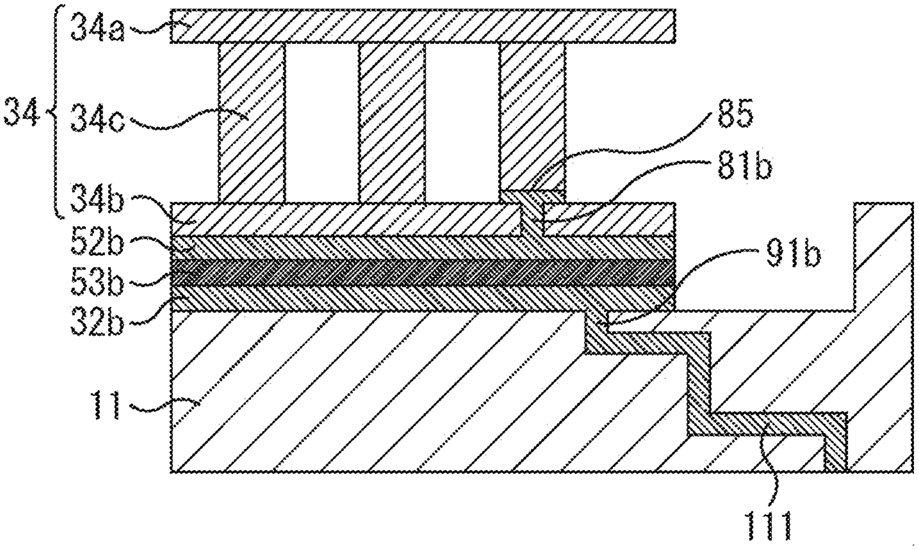
FIG. 8 is a cross-sectional view of a portion of the package that is situated around vias.

Next, connection made through the via 81*b* illustrated in FIG. 6 and connection made through the via 91*b* illustrated in FIG. 7 are described with reference to FIG. 8. FIG. 8 is a cross-sectional view of a portion of the package 11 that is situated around the vias 81*b* and 91*b*, where the Peltier element 34 is arranged in the package 11.

As illustrated in FIG. 8, the one end 85 of the pole portion 34*c* and the back-surface terminal 52*b* formed on the Peltier element 34 are connected to each other through the via 81*b*, and the back-surface terminal 52*b* is connected to the upper-surface terminal 32*b* using the conductive resin 53*b*. In other words, the Peltier element 34 and the upper-surface terminal 32*b* are electrically continuous with each other through the via 81*b*. An external terminal such as the pin terminal 15 and the upper-surface terminal 32*b* are electrically connected to each other through the via 91*b* for the upper-surface terminal 32*b* using internal wiring 111. The via 81*b* and the via 91*b* are arranged such that a route between the one end 85 of the pole portion 34*c* of the Peltier element 34 and the external terminal is shortest without the electrical properties being blocked. This makes it possible to reduce the resistance between the one end 85 of the pole portion 34*c* and the external terminal.

As in the case of the via 81*b*, the other end of the pole portion 34*c* and the back-surface terminal 52*a* are connected to each other through the via 81*a*, and this results in the Peltier element 34 and the upper-surface terminal 32*a* being electrically continuous with each other, although an illustration thereof is omitted. An external terminal such as the pin terminal 15 and the upper-surface terminal 32*a* are electrically connected to each other through the via 91*a* for the upper-surface terminal 32*a* using internal wiring. The via 81*a* and the via 91*a* are arranged such that a route between the other end of the pole portion 34*c* and the external terminal is shortest without the electrical properties being blocked. This makes it possible to reduce the resistance between the other end of the pole portion 34*c* and the external terminal.

In order to eliminate a difference in linear expansion between the lower substrate 34*b* and the package 11, the lower substrate 34*b* and the package 11 are favorably made of the same material. For example, the material of the lower substrate 34*b* and the package 11 may be ceramics.

<Method for Arranging Sensor Chip>

Figure 9:
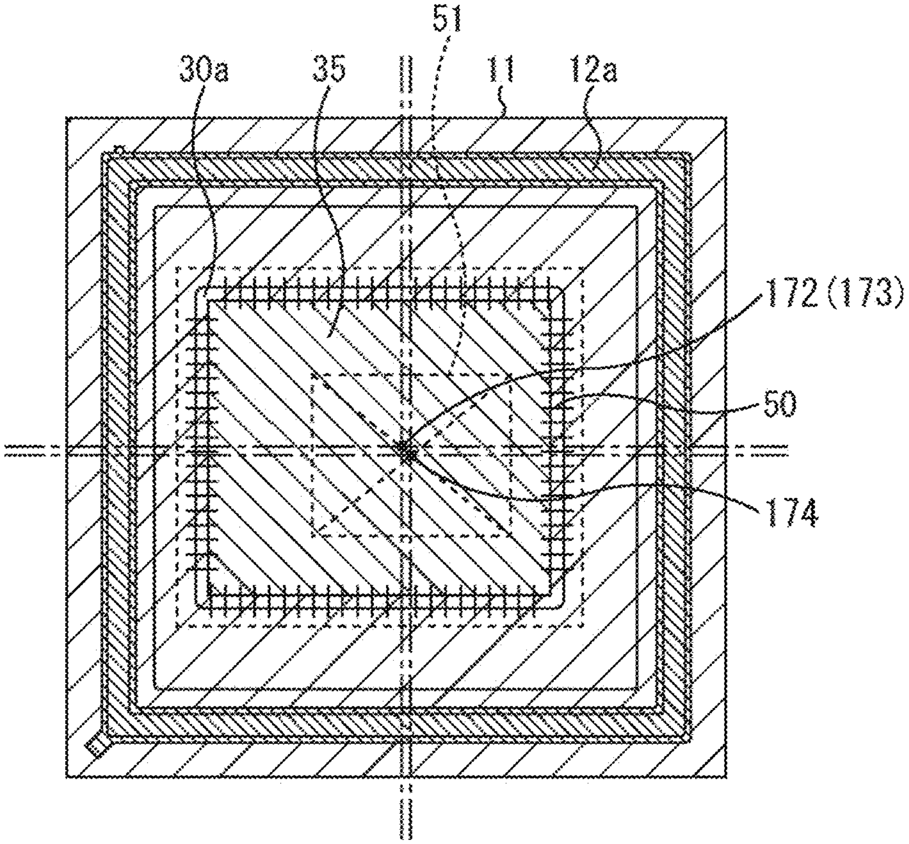
FIG. 9 is a top view of the package that is used to describe a method for arranging a sensor chip.

FIG. 9 is a top view of the package 11 that is used to describe a method for arranging the sensor chip 35, where the metallic ring 12*a* is arranged on the package 11.

FIG. 9 illustrates the light-receiving surface 51 on the sensor chip 35 in a see-through state. As illustrated in FIG. 9, the sensor chip 35 is arranged inside of the concave portion 30 such that a center 172 of the sensor chip 35 coincides with a center 173 of the concave portion 30. Even when a center 174 of (a pixel array of) the light-receiving surface 51 is misaligned with the center 172 of the sensor chip 35, as illustrated in FIG. 9, the position of the concave portion 30 relative to the position of the sensor chip 35 is corrected (offset) on the basis of an amount of the misalignment such that the center 172 of the sensor chip 35 and the center 173 of the concave portion 30 coincide.

As described above, the sensor chip 35 is arranged such that the center 172 of the sensor chip 35 and the center 173 of concave portion 30 coincide, and this makes it possible to prevent the wire 50 from being made longer. On the other hand, when a Peltier element is mounted using the lead winding method, there is a need to connect a lead wire to a terminal of a package. This results in difficulty in correcting the position of a concave portion relative to the position of a sensor chip.

<Example of Mounting Semiconductor Apparatus>

Figure 10:
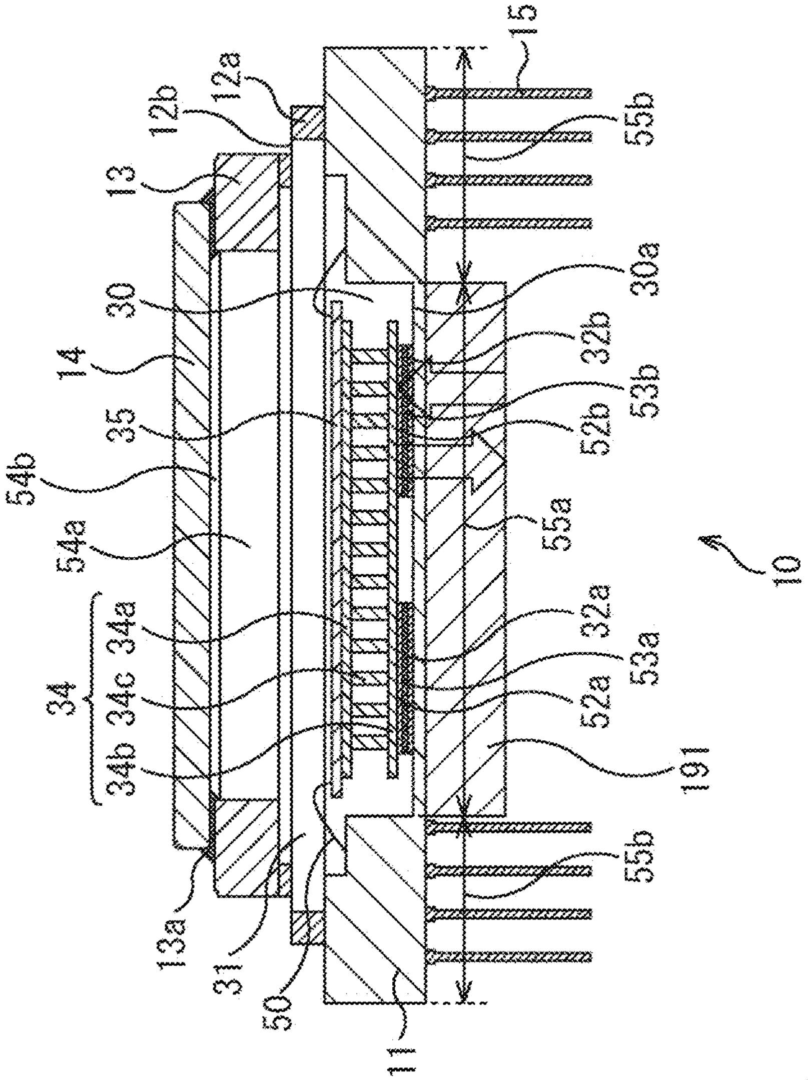
FIG. 10 is a cross-sectional view illustrating an example of mounting the semiconductor apparatus.

FIG. 10 is a cross-sectional view illustrating an example of mounting the semiconductor apparatus 10.

For example, a heat sink 191 is arranged in the region 55*a* on the back surface of the package 11 of the semiconductor apparatus 10 when the semiconductor apparatus 10 is mounted, as illustrated in FIG. 10. Thus, heat released through the back surface of the lower substrate 34*b* passes through the back-surface terminals 52*a* and 52*b*, the conductive resins 53*a* and 53*b*, the upper-surface terminals 32*a* and 32*b*, and the package 11 to be released to the heat sink 191, and then the heat is released into, for example, the outside air from the heat sink 191.

Note that, as described above, the pin terminal 15 is formed in the region 55*b* other than the region 55*a* on the back surface of the package 11. Thus, the heat sink 191 can be arranged in the region 55*a*. The heat sink 191 is formed in the region 55*a* in the example illustrated in FIG. 10. However, it is sufficient if the region in which the heat sink 191 is formed includes a region that faces a region that is situated on the upper surface 30*a* and in which the Peltier element 34 is arranged, and thus the region in which the heat sink 191 is formed may be smaller than the region 55*a*. In this case, the region in which the pin terminal 15 is formed is a region, in a region on the back surface of the package 11, that is larger than the region 55*b* and other than the region in which the heat sink 191 is formed.

The semiconductor apparatus 10 in which the heat sink 191 is arranged is mounted on an external substrate (not illustrated), and is electrically connected to the external substrate (not illustrated) using the pin terminal 15. Thus, when the Peltier element 34 is brought into conduction, the lower substrate 34*b* is brought into conduction by the external substrate (not illustrated) using the pin terminal 15, the internal wiring 111 and the like, the upper-surface terminals 32*a* and 32*b*, the conductive resins 53*a* and 53*b*, and the back-surface terminals 52*a* and 52*b*. In other words, a method for providing electrical continuity with the Peltier element 34 corresponds to a back-surface electrical-continuity method that includes providing electrical continuity with the Peltier element 34 from the back surface of the lower substrate 34*b*.

As described above, the semiconductor apparatus 10 includes the package 11 including the concave portion 30, the sensor chip 35 arranged in the concave portion 30, and the Peltier element 34 arranged between the sensor chip 35 and the package 11. The back-surface terminal 52*a* (52*b*) and the upper-surface terminal 32*a* (32*b*) are electrically connected to each other through the conductive resin 53*a* (53*b*), the back-surface terminal 52*a* (52*b*) being formed on the back surface of the lower substrate 34*b* of the Peltier element 34, the upper-surface terminal 32*a* (32*b*) being formed on the upper surface of the concave portion 30 to face the back-surface terminal 52*a* (52*b*). Thus, there is no need for a Peltier connection space and a relay substrate, compared to when the lead winding method is adopted. This makes it possible to make the package 11 smaller in size.

Further, when, for example, a Peltier element is mounted using the back-surface soldering connection method, it will be difficult to hold the formation of a sensor chip by self-alignment performed upon reflow soldering, and thus to prevent sensor misalignment (mounting misalignment) from being caused in the sensor chip. Note that the sensor misalignment refers to a state in which a sensor chip is tilted with respect to a mounting surface upon mounting the sensor chip. On the other hand, in the semiconductor apparatus 10, the back-surface terminal 52*a* (52*b*) and the upper-surface terminal 32*a* (32*b*) are electrically connected to each other through the conductive resin 53*a* (53*b*). Thus, the formation of the Peltier element 34 can be held, compared to when the back-surface soldering connection method is adopted. This makes it possible to prevent sensor misalignment from being caused in the sensor chip 35 provided on the Peltier element 34. This results in being able to improve the accuracy in detection performed by the sensor chip 35.

First Other Example of Configuration Between Peltier Element and Package

In the semiconductor apparatus 10 described above, the upper-surface terminals 32*a* and 32*b*, the back-surface terminals 52*a* and 52*b*, and the conductive resins 53*a* and 53*b* have the same length-and-width size. However, an upper-surface terminal may have a larger length-and-width size than a back-surface terminal.

Figure 11:
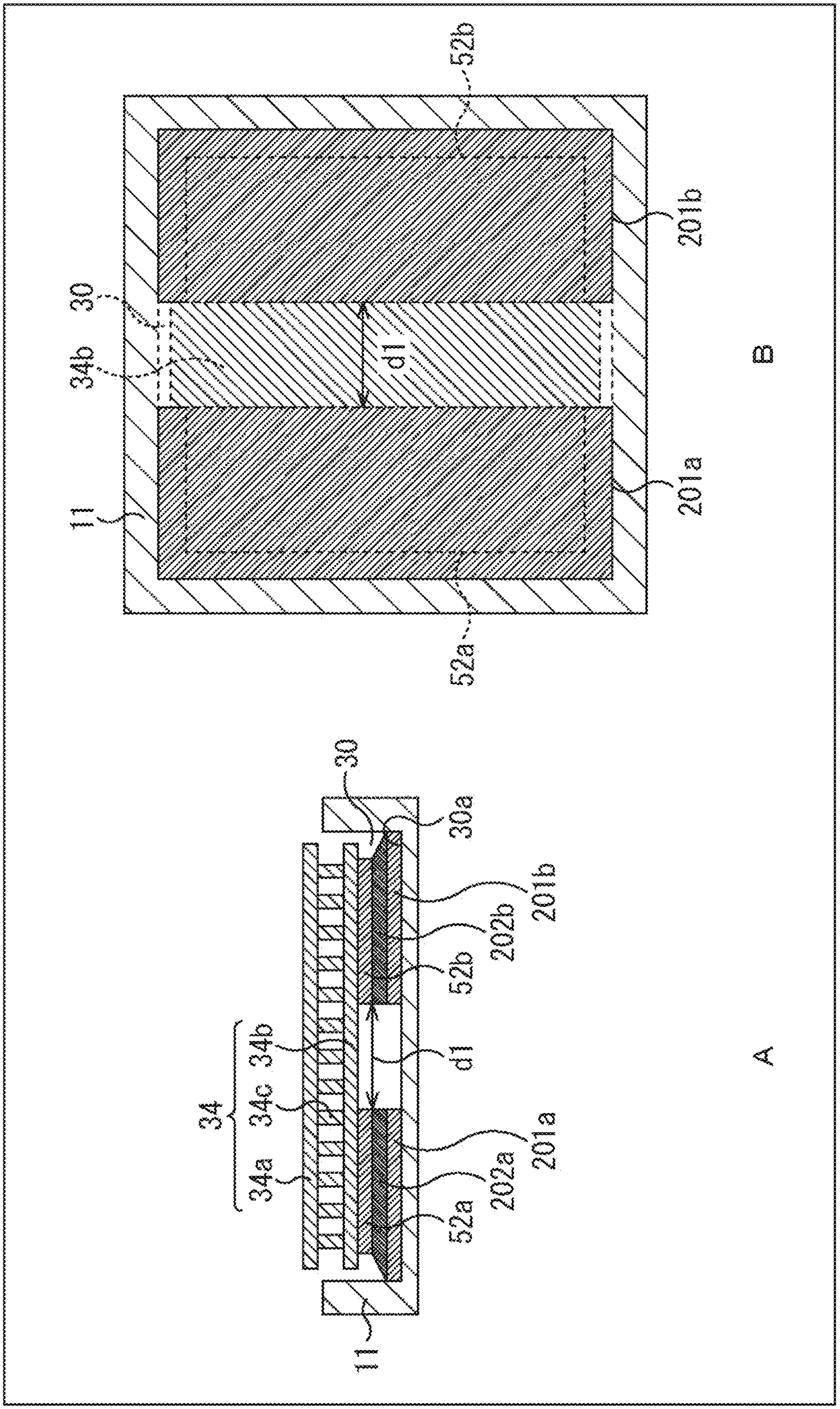
FIG. 11 is a set of an enlarged view of a cross section and a diagram illustrating a back surface according to a first other example of the configuration of a semiconductor apparatus.

A of FIG. 11 is an enlarged view of a rectangle, in a semiconductor apparatus in this case, that corresponds to the rectangle P illustrated in FIG. 3, and B of FIG. 11 illustrates the rectangle as viewed from the back surface of the package 11. B of FIG. 11 illustrates the interior of the package 11 in a see-through state.

A certain portion, in the semiconductor apparatus illustrated in FIG. 11, that corresponds to a certain portion in the semiconductor apparatus 10 illustrated in FIG. 3 is denoted by the same reference numeral as the certain portion in the semiconductor apparatus 10 illustrated in FIG. 3. Thus, a detailed description thereof is omitted as appropriate, and the description is made focused on another portion, in the semiconductor apparatus illustrated in FIG. 11, that is different from another portion in the semiconductor apparatus 10 illustrated in FIG. 3.

The semiconductor apparatus illustrated in FIG. 11 is different from the semiconductor apparatus 10 illustrated in FIG. 3 in including upper-surface terminals 201*a* and 201*b* and conductive resins 202*a* and 202*b* instead of the upper-surface terminals 32*a* and 32*b* and the conductive resins 53*a* and 53*b*. Regarding the other points, the semiconductor apparatus illustrated in FIG. 11 has a configuration similar to the configuration of the semiconductor apparatus 10 illustrated in FIG. 3.

As illustrated in A and B of FIG. 11, the upper-surface terminal 201*a* is different from the upper-surface terminal 32*a* in that the upper-surface terminal 201*a* situated on the upper surface 30*a* has a larger length-and-width size than the back-surface terminal 52*a* situated on the back surface of the lower substrate 34*b*. Regarding the other points, the upper-surface terminal 201*a* is similar to the upper-surface terminal 32*a*. Since the upper-surface terminal 201*a* has a larger length-and-width size than the back-surface terminal 52*a*, a fillet can be formed in the conductive resin 202*a* formed on the upper-surface terminal 201*a* to make the surface area of the conductive resin 202*a* larger. This makes it possible to reduce the resistance.

As in the case of the upper-surface terminal 201*a*, the upper-surface terminal 201*b* is different from the upper-surface terminal 32*b* in that the upper-surface terminal 201*b* situated on the upper surface 30*a* has a larger length-and-width size than the back-surface terminal 52*b* situated on the back surface of the lower substrate 34*b*. Regarding the other points, the upper-surface terminal 201*b* is similar to the upper-surface terminal 32*b*. Thus, a fillet can also be formed in the conductive resin 202*b* formed on the upper-surface terminal 201*b* to reduce the resistance. The fillet of each of the conductive resins 202*a* and 202*b* is uniform peripherally.

Second Other Example of Configuration Between Peltier Element and Package

In the semiconductor apparatus 10 described above, spacing between the upper-surface terminals 32*a* and 32*b*, spacing between the back-surface terminals 52*a* and 52*b*, and spacing between the conductive resins 53*a* and 53*b* correspond to the same specified distance d1. However, spacing between upper-surface terminals may be larger than spacing between back-surface terminals.

Figure 12:
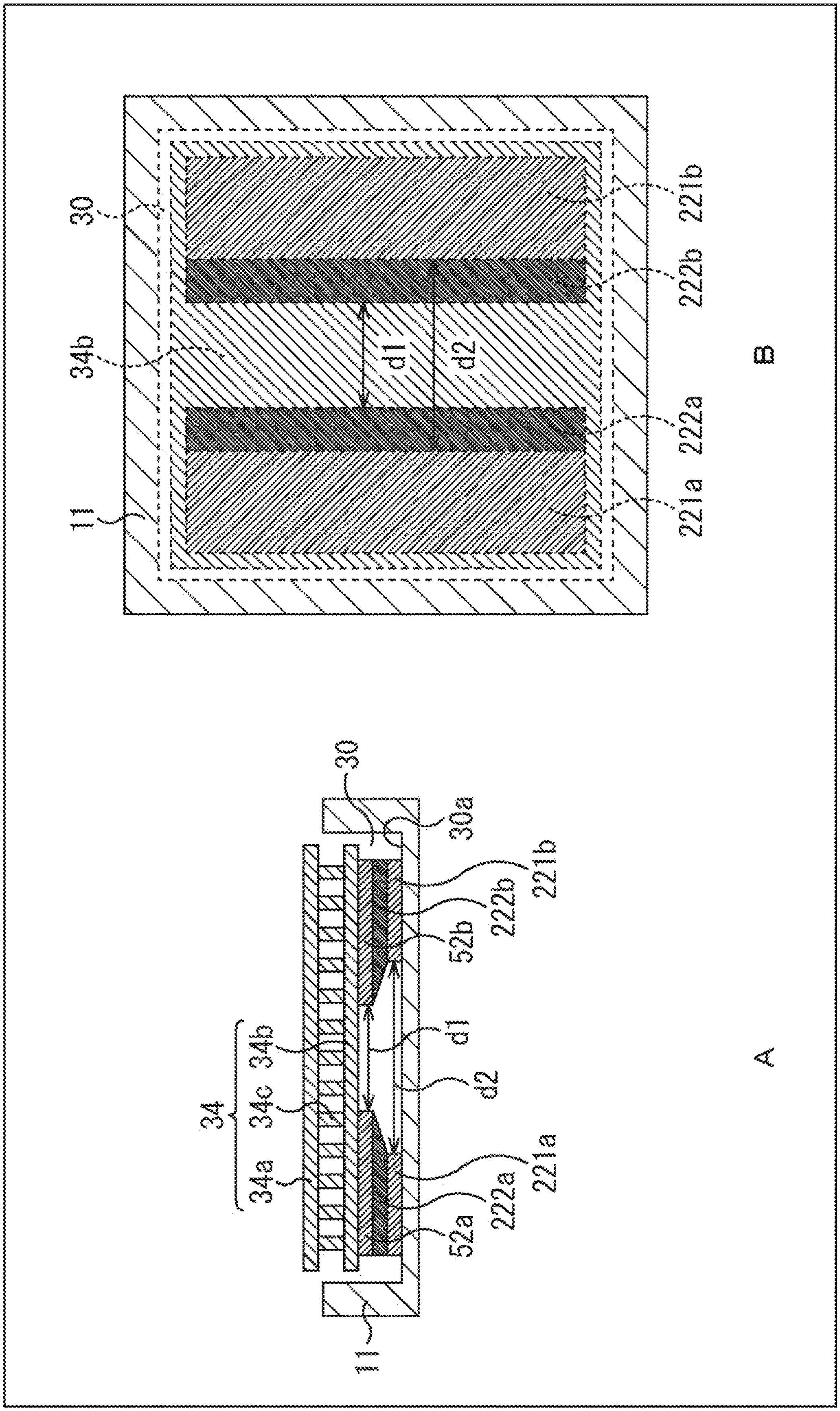
FIG. 12 is a set of an enlarged view of a cross section and a diagram illustrating a back surface according to a second other example of the configuration of a semiconductor apparatus.

A of FIG. 12 is an enlarged view of a rectangle, in a semiconductor apparatus in this case, that corresponds to the rectangle P illustrated in FIG. 3, and B of FIG. 12 illustrates the rectangle as viewed from the back surface of the package 11. B of FIG. 12 illustrates the interior of the package 11 in a see-through state.

A certain portion, in the semiconductor apparatus illustrated in FIG. 12, that corresponds to a certain portion in the semiconductor apparatus 10 illustrated in FIG. 3 is denoted by the same reference numeral as the certain portion in the semiconductor apparatus 10 illustrated in FIG. 3. Thus, a detailed description thereof is omitted as appropriate, and the description is made focused on another portion, in the semiconductor apparatus illustrated in FIG. 12, that is different from another portion in the semiconductor apparatus 10 illustrated in FIG. 3.

The semiconductor apparatus illustrated in FIG. 12 is different from the semiconductor apparatus 10 illustrated in FIG. 3 in including upper-surface terminals 221*a* and 221*b* and conductive resins 222*a* and 222*b* instead of the upper-surface terminals 32*a* and 32*b* and the conductive resins 53*a* and 53*b*. Regarding the other points, the semiconductor apparatus illustrated in FIG. 12 has a configuration similar to the configuration of the semiconductor apparatus 10 illustrated in FIG. 3.

As illustrated in A and B of FIG. 12, the upper-surface terminal 221*a* is different from the upper-surface terminal 32*a* in having a smaller size widthwise (in a direction in which the upper-surface terminals 221*a* and 221*b* are arranged) than the back-surface terminal 52*a*, and in that spacing between the upper-surface terminals 221*a* and 221*b* corresponds to a specified distance d2 that is larger than the specified distance d1. Regarding the other points, the upper-surface terminal 221*a* is similar to the upper-surface terminal 32*a*.

As in the case of the upper-surface terminal 221*a*, the upper-surface terminal 221*b* is different from the upper-surface terminal 32*b* in having a smaller size widthwise than the back-surface terminal 52*b*, and in that spacing between the upper-surface terminals 221*a* and 221*b* corresponds to the specified distance d2 larger than the specified distance d1. Regarding the other points, the upper-surface terminal 221*b* is similar to the upper-surface terminal 32*b*.

As described above, spacing between the upper-surface terminals 221*a* and 221*b* corresponds to the specified distance d2 larger than the specified distance d1 corresponding to spacing between the back-surface terminals 52*a* and 52*b*. This makes it possible to prevent a short circuit from being caused between the upper-surface terminals 221*a* and 221*b*, compared to when the spacing between the upper-surface terminals 221*a* and 221*b* corresponds to the specified distance d1.

Third Other Example of Configuration Between Peltier Element and Package

In the semiconductor apparatus 10 described above, nothing is provided in a region situated between the upper-surface terminals 32*a* and 32*b* on the upper surface 30*a* of the package 11. However, a convex portion may be provided in the region.

Figure 13:
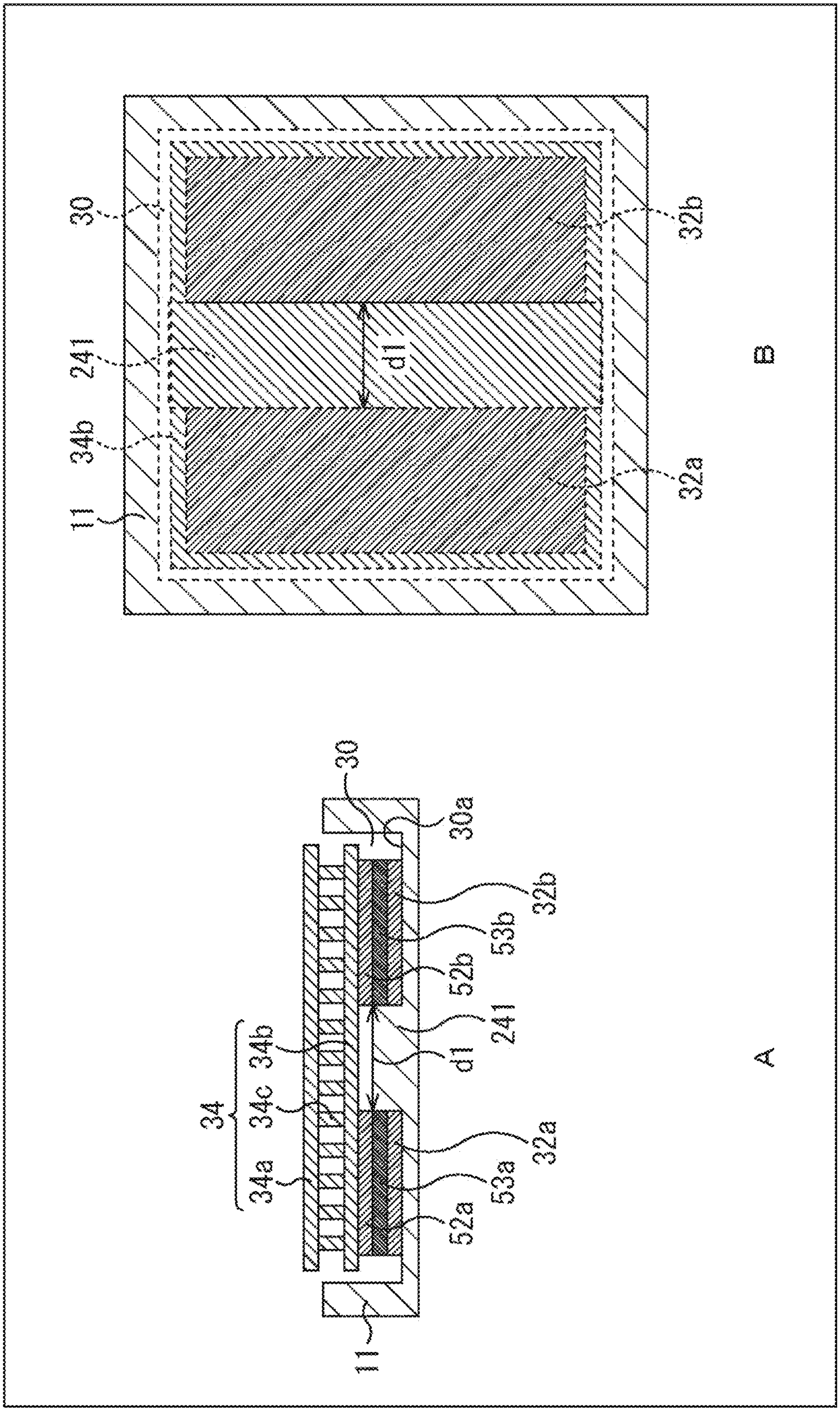
FIG. 13 is a set of an enlarged view of a cross section and a diagram illustrating a back surface according to a third other example of the configuration of a semiconductor apparatus.

A of FIG. 13 is an enlarged view of a rectangle, in a semiconductor apparatus in this case, that corresponds to the rectangle P illustrated in FIG. 3, and B of FIG. 13 illustrates the rectangle as viewed from the back surface of the package 11. B of FIG. 13 illustrates the interior of the package 11 in a see-through state.

A certain portion, in the semiconductor apparatus illustrated in FIG. 13, that corresponds to a certain portion in the semiconductor apparatus 10 illustrated in FIG. 3 is denoted by the same reference numeral as the certain portion in the semiconductor apparatus 10 illustrated in FIG. 3. Thus, a detailed description thereof is omitted as appropriate, and the description is made focused on another portion, in the semiconductor apparatus illustrated in FIG. 13, that is different from another portion in the semiconductor apparatus 10 illustrated in FIG. 3.

The semiconductor apparatus illustrated in FIG. 13 is different from the semiconductor apparatus 10 illustrated in FIG. 3 in that a convex portion 241 is provided in the region situated between the upper-surface terminals 32*a* and 32*b* on the upper surface 30*a*. Regarding the other points, the semiconductor apparatus illustrated in FIG. 13 has a configuration similar to the configuration of the semiconductor apparatus 10 illustrated in FIG. 3.

In the semiconductor apparatus illustrated in FIG. 13, the convex portion 241 including an insulator such as ceramics is formed in the region situated between the upper-surface terminals 32*a* and 32*b* on the upper surface 30, as illustrated in A and B of FIG. 13. In the example illustrated in FIG. 13, the convex portion 241 has a height that corresponds to a height measured from the upper surface 30*a* to upper surfaces of the conductive resins 53*a* and 53*b*. In the semiconductor apparatus illustrated in FIG. 13, the convex portion 241 including an insulator is formed between the upper-surface terminals 32*a* and 32*b*. This makes it possible to prevent a short circuit from being caused between the upper-surface terminals 32*a* and 32*b*.

Fourth Other Example of Configuration Between Peltier Element and Package

As described with reference to FIG. 4, in the semiconductor apparatus 10, a region that corresponds to the distance d1 and in which nothing is provided, is formed between the upper-surface terminals 32*a* and 32*b* on the upper surface 30*a* of the package 11. The back-surface terminal 52*a* and the upper-surface terminal 32*a* are electrically connected to each other through the conductive resin 53*a*, and the back-surface terminal 52*b* and the upper-surface terminal 32*b* are electrically connected to each other through the conductive resin 53*b*.

However, during the manufacturing processes, there may be a variation in the area of each of the conductive resins 53*a* and 53*b* or a spillover of the conductive resins 53*a* and 53*b* due to warpage of the package 11 or the Peltier element 34 or due to a variation in an amount of applying the conductive resins 53*a* and 53*b*. This may result in causing a short circuit between the conductive resins 53*a* and 53*b*, and a short circuit between the pole portion 34*c* of the Peltier element 34 and at least one of the conductive resin 53*a* or the conductive resin 53*b* due to the at least one of the conductive resin 53*a* or the conductive resin 53*b* extending upward to a lateral surface of the Peltier element 34.

Figure 14:
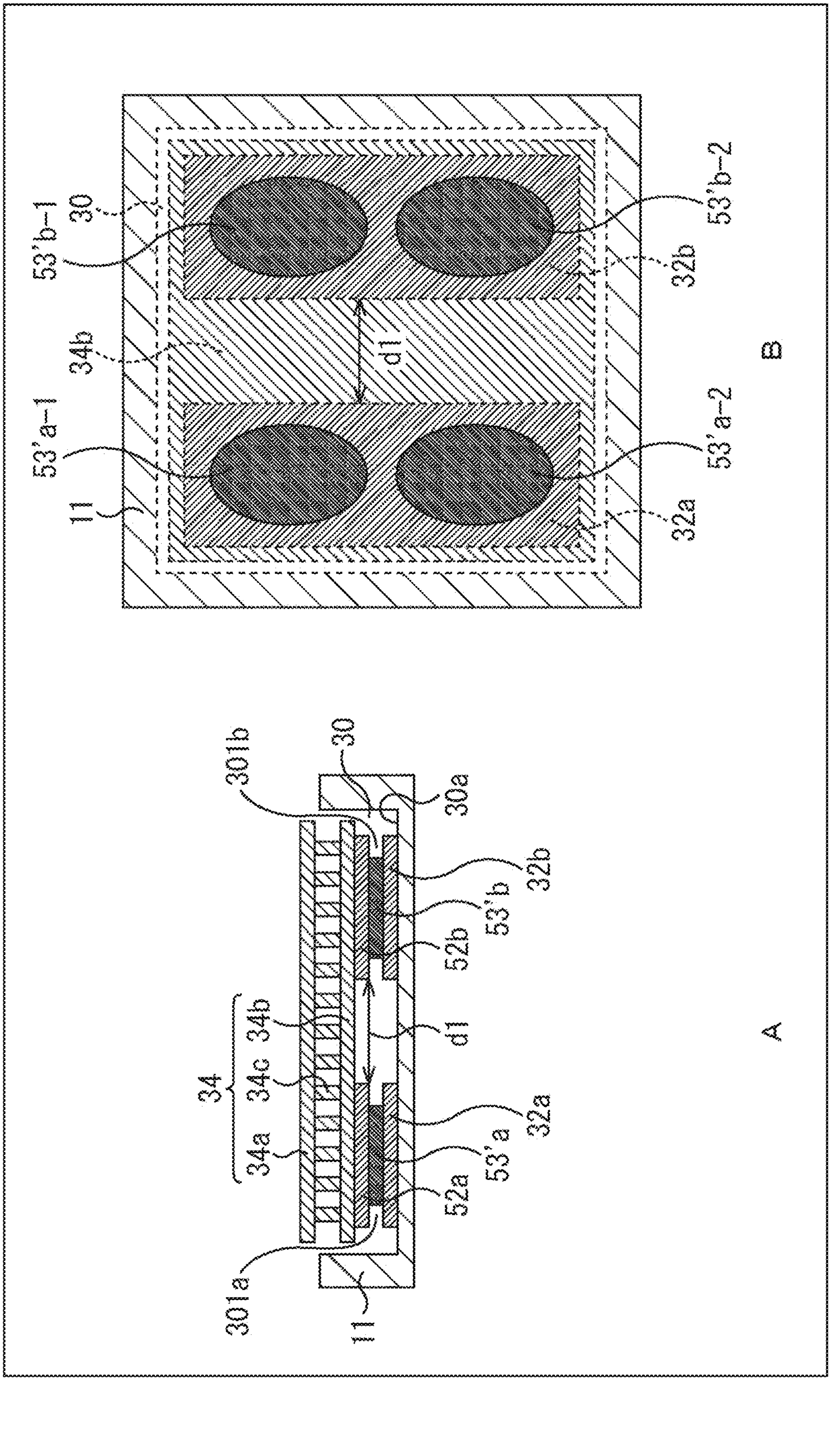
FIG. 14 is a set of an enlarged view of a cross section and a diagram illustrating a back surface that are used to describe an actual arrangement of conductive resins in the semiconductor apparatus illustrated in FIG. 4.

Thus, it is conceivable that, in order to prevent the above-described short circuit from being caused, the area of a region in which each of the conductive resins 53*a* and 53*b* could be made smaller and the formation region could be divided such that the conductive resin 53*a* does not spill out of a space situated between the upper-surface terminal 32*a* and the back-surface terminal 52*a* and such that the conductive resin 53*b* does not spill out of a space situated between the upper-surface terminal 32*b* and the back-surface terminal 52*b*, as in the case of conductive resins 53'*a*-1 and 53'*a*-2 as well as conductive resins 53'*b*-1 and 53'*b*-2 illustrated in A and B of FIG. 14. This is for preventing a short circuit from being caused due to the spillover of the conductive resins 53*a* and 53*b*.

However, when the area of a region in which a conductive resin 53'*a* is formed, and the area of a region in which a conductive resin 53'*b* is formed are each made smaller, and when the formation regions are each divided, spaces 301*a* and 301*b* are respectively widely formed between the upper-surface terminal 32*a* and the back-surface terminal 52*a* and between the upper-surface terminal 32*b* and the back-surface terminal 52*b*, and the area of the conductive resin 53'*a* and the area of the conductive resin 53'*b* are each made smaller. This results in the area of contact with the package 11 being smaller than the outer area of the Peltier element 34.

The conductive resins 53'*a*-1 and 53'*a*-2 as well as the conductive resins 53'*b*-1 and 53'*b*-2 serve as a heat transport path that releases, to a heat sink, heat generated by the semiconductor apparatus 10. Thus, when the area of contact with the package 11 is smaller than the outer area of the Peltier element 34, this results in losing a cooling capability of the entirety of the package 11.

Figure 15:
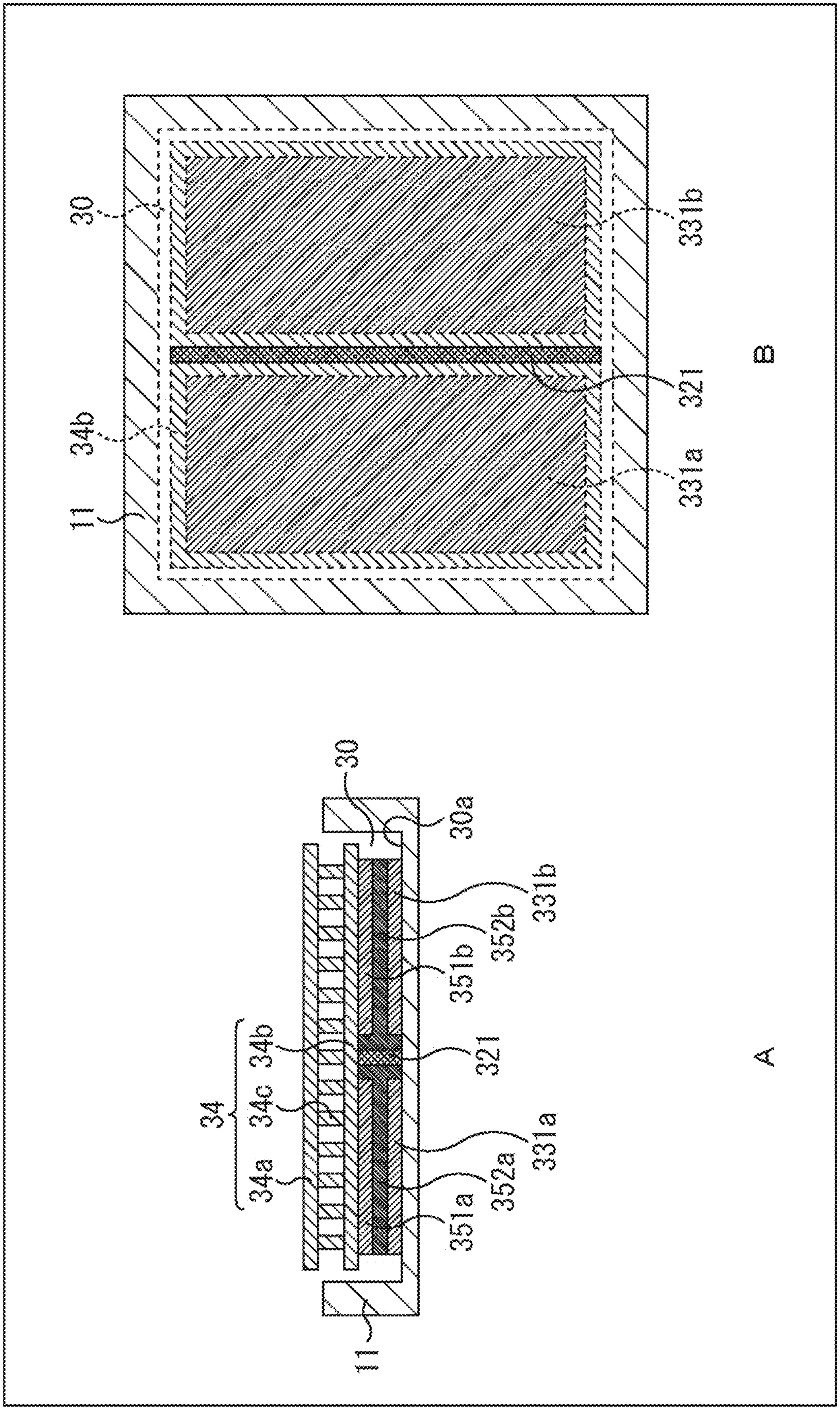
FIG. 15 is a set of an enlarged view of a cross section and a diagram illustrating a back surface according to a fourth other example of the configuration of a semiconductor apparatus.

Thus, as illustrated in A and B of FIG. 15, upper-surface terminals 331*a* and 331*b* that respectively correspond to the upper-surface terminals 32*a* and 32*b* are provided, and a thermosetting insulation film 321 is formed midway between the upper-surface terminals 331*a* and 331*b*.

The thermosetting insulation film 321 is a film that is made of a thermosetting insulating material. While separating the lower substrate 34*b* of the Peltier element 34 from the upper surface 30*a* of the concave portion 30 of the package 11, the thermosetting insulation film 321 serves as a heat transport path and serves as a partition that separates, from a space that is situated in the concave portion 30 and in which the upper-surface terminal 331*a* is formed, a space that is situated in the concave portion 30 and in which the upper-surface terminal 331*b* is formed.

The upper-surface terminals 331*a* and 331*b* respectively have the same basic configuration as the upper-surface terminals 32*a* and 32*b*. However, a region in which the upper-surface terminal 331*a* is formed, and a region in which the upper-surface terminal 331*b* is formed can each be broaden up to around the midway point at which the thermosetting insulation film 321 is provided, compared to the case of the upper-surface terminals 32*a* and 32*b*.

Further, back-surface terminals 351*a* and 351*b* that respectively include the same function as the back-surface terminals 52*a* and 52*b* are each provided on the lower substrate 34*b* of the Peltier element 34. The back-surface terminal 351*a* is provided to have the same area as the upper-surface terminal 331*a* at a position at which the back-surface terminal 351*a* faces the upper-surface terminal 331*a*, and the back-surface terminal 351*b* is provided to have the same area as the upper-surface terminal 331*b* at a position at which the back-surface terminal 351*b* faces the upper-surface terminal 331*b*.

Furthermore, conductive resins 352*a* and 352*b* that respectively include functions respectively corresponding to the functions of the conductive resins 53*a* and 53*b* are respectively formed between the upper-surface terminal 331*a* and the back-surface terminal 351*a* and between the upper-surface terminal 331*b* and the back-surface terminal 351*b*. The conductive resin 352*a* is formed to have substantially the same area as the upper-surface terminal 331*a* and the back-surface terminal 351*a* at substantially the same position as the upper-surface terminal 331*a* and the back-surface terminal 351*a*, and the conductive resin 352*b* is formed to have substantially the same area as the upper-surface terminal 331*b* and the back-surface terminal 351*b* at substantially the same position as the upper-surface terminal 331*b* and the back-surface terminal 351*b*.

The thermosetting insulation film 321 is configured to serve as a partition that separates, from a space formed by the upper-surface terminal 331*a* and the back-surface terminal 351*a*, a space formed by the upper-surface terminal 331*b* and the back-surface terminal 351*b*, and thus prevents the conductive resins 352*a* and 352*b* from being brought into contact with each other. This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward.

The thermosetting insulation film 321 is less elastic before being hardened, in order to reduce a load imposed upon mounting the Peltier element 34. Favorably, the thermosetting insulation film 321 has a modulus of elasticity of 5 MPa or less. Favorably, the thermosetting insulation film 321 has a thickness that enables the thermosetting insulation film 321 to serve as a partition that prevents a short circuit from being caused between the conductive resins 352*a* and 352*b* upon mounting the Peltier element 34, and enables the thermosetting insulation film 321 to absorb warpage of the package 11. Favorably, the thermosetting insulation film 321 has a width that prevents the thermosetting insulation film 321 from reaching the upper-surface terminals 331*a* and 331*b* as well as the back-surface terminals 351*a* and 351*b*. For example, the thermosetting insulation film 321 has a thickness of about 50 μm or more and a width of about 1 mm.

The thermosetting insulation film 321 is arranged substantially midway between the conductive resins 352*a* and 352*b* having different potentials to separate the conductive resins 352*a* and 352*b*. The thermosetting insulation film 321 is provided to at least have a greater length in a vertical direction in B of FIG. 15 than the upper-surface terminals 331*a* and 331*b* as well as the back-surface terminals 351*a* and 351*b*. Note that, in B of FIG. 15, the thermosetting insulation film 321 has a length that is similar to the length of an outer shape of the Peltier element 34. However, the thermosetting insulation film 321 favorably has a greater length. The thermosetting insulation film 321 may be provided to have a length that is greater than the length of the outer shape of the Peltier element 34, or may have a length that is equal to the length of the upper surface 30*a* of the concave portion 30.

This results in preventing a short circuit from being caused between the conductive resins 352*a* and 352*b*. Thus, there is no need to form the conductive resins 352*a* and 352*b* such that the conductive resin 352*a* has a smaller area than the upper-surface terminal 331*a* and the back-surface terminal 351*a* and such that the conductive resin 352*b* has a smaller area than the upper-surface terminal 331*b* and the back-surface terminal 351*b*.

Accordingly, the back-surface terminals 351*a* and 351*b*, the conductive resins 352*a* and 352*b*, and the upper-surface terminals 331*a* and 331*b* can be respectively formed to have larger areas than the back-surface terminals 52*a* and 52*b*, the conductive resins 53*a* and 53*b*, and the upper-surface terminals 32*a* and 32*b*.

Further, the conductive resins 352*a* and 352*b* can be filled until the conductive resins 352*a* and 352*b* are brought into contact with the thermosetting insulation film 321. This enables the thermosetting insulation film 321 and a region situated around the thermosetting insulation film 321 to be used as a heat transport path between the back surface of the Peltier element 34 and the upper surface 30*a* of the package 11.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward. Further, this makes it possible to expand a heat transport path that releases, to the heat sink 191, heat generated by the semiconductor apparatus 10, and thus to improve a cooling capability of the entirety of the package 11.

Modifications of Fourth Other Example of Configuration Between Peltier Element and Package The example in which the thermosetting insulation film 321 is arranged substantially midway between the conductive resins 352*a* and 352*b* having different potentials to separate the conductive resins 352*a* and 352*b* has been described above. However, the thermosetting insulation film 321 may be arranged at a position other than the position described above.

First Modification of Fourth Other Example of Configuration

Figure 16:
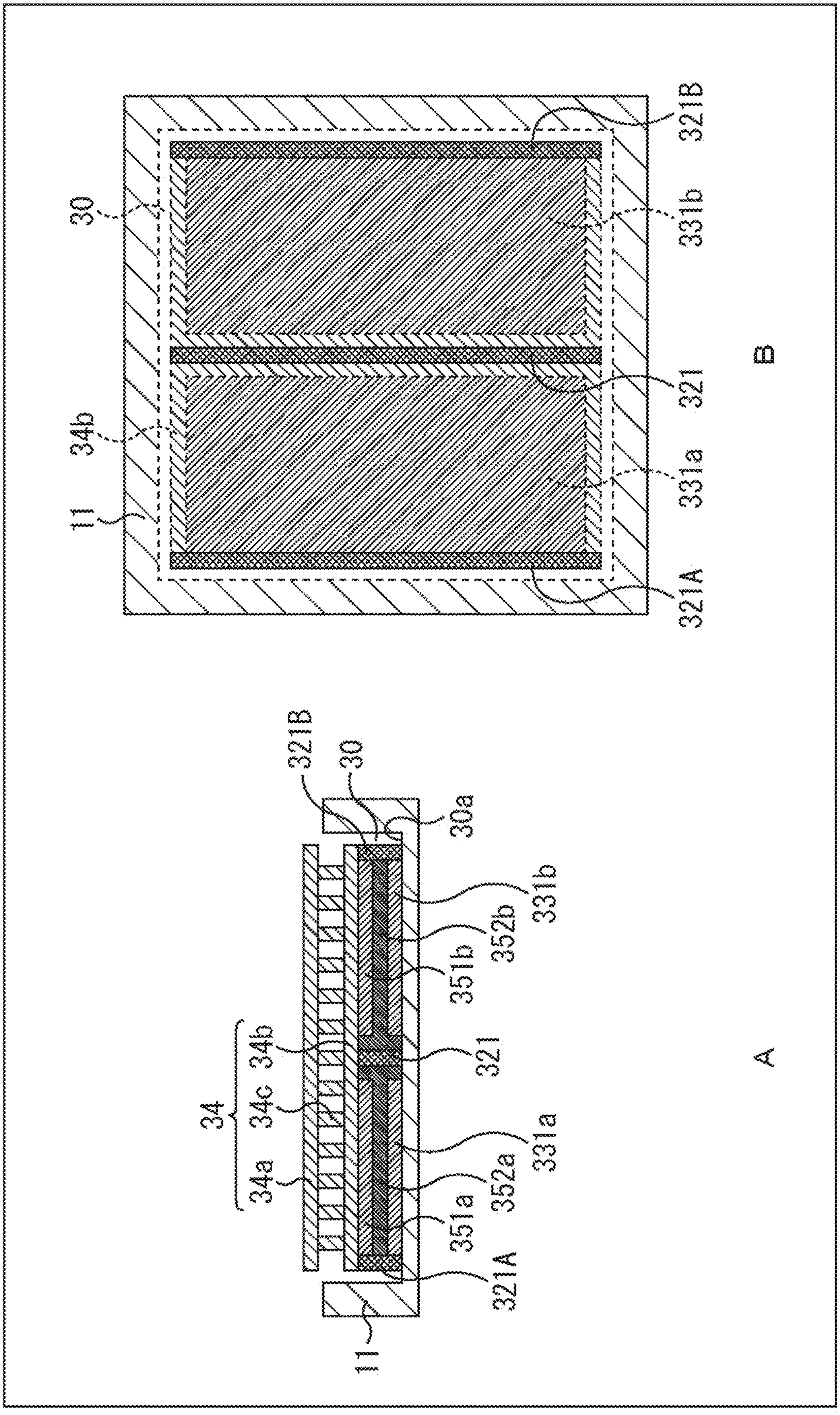
FIG. 16 is a set of an enlarged view of a cross section and a diagram illustrating a back surface according to a first modification of the fourth other configuration of the semiconductor apparatus.

For example, in addition to the thermosetting insulation film 321 arranged substantially midway between the conductive resins 352*a* and 352*b* having different potentials to separate the conductive resins 352*a* and 352*b*, a thermosetting insulation film 321A may be provided across the conductive resin 352*a* from the thermosetting insulation film 321, and a thermosetting insulation film 321B may be provided across the conductive resin 352*b* from the thermosetting insulation film 321, as illustrated in A and B of FIG. 16.

Even if the conductive resin 352*a* formed between the back-surface terminal 351*a* and the upper-surface terminal 331*a* and the conductive resin 352*b* formed between the back-surface terminal 351*b* and the upper-surface terminal 331*b* respectively spill over, during the manufacturing processes, beyond ends of the back-surface terminal 351*a* and the upper-surface terminal 331*a* and beyond ends of the back-surface terminal 351*b* and the upper-surface terminal 331*b*, such a configuration will lead the conductive resins 352*a* and 352*b* in a direction of the length of the thermosetting insulation film 321.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward. Further, this makes it possible to expand a heat transport path that releases, to the heat sink 191, heat generated by the semiconductor apparatus 10, and thus to improve a cooling capability of the entirety of the package 11.

Second Modification of Fourth Other Example of Configuration

Figure 17:
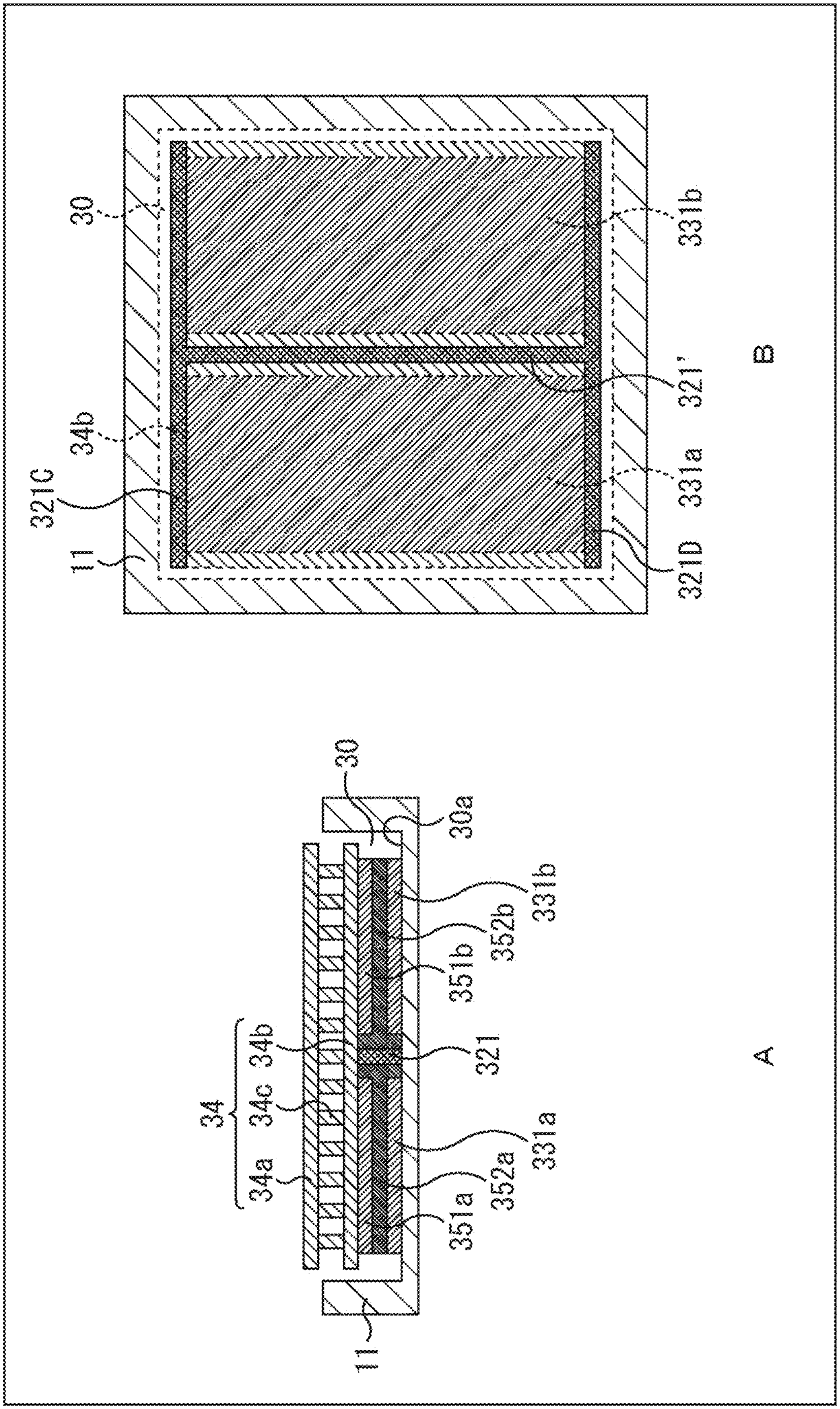
FIG. 17 is a set of an enlarged view of a cross section and a diagram illustrating a back surface according to a second modification of the fourth other configuration of the semiconductor apparatus.

Further, for example, a thermosetting insulation film 321' that corresponds to the thermosetting insulation film 321 arranged substantially midway between the conductive resins 352*a* and 352*b* having different potentials to separate the conductive resins 352*a* and 352*b* may be provided, and thermosetting insulation films 321C and 321D may each be provided vertically to the thermosetting insulation film 321' to be respectively connected to two ends of the thermosetting insulation film 321', as illustrated in A and B of FIG. 17. Note that the thermosetting insulation film 321' has the same configuration as the thermosetting insulation film 321 in principle, although the two ends of the thermosetting insulation film 321' are respectively connected to substantially middle portions of the thermosetting insulation films 321C and 321D.

Even if the conductive resin 352*a* formed between the back-surface terminal 351*a* and the upper-surface terminal 331*a* and the conductive resin 352*b* formed between the back-surface terminal 351*b* and the upper-surface terminal 331*b* respectively spill over, during the manufacturing processes, beyond ends of the back-surface terminal 351*a* and the upper-surface terminal 331*a* and beyond ends of the back-surface terminal 351*b* and the upper-surface terminal 331*b*, such a configuration will lead the conductive resins 352*a* and 352*b* in a direction of the lengths of the thermosetting insulation films 321C and 321D that is a direction opposite to the thermosetting insulation film 321'.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward. Further, this makes it possible to expand a heat transport path that releases, to the heat sink 191, heat generated by the semiconductor apparatus 10, and thus to improve a cooling capability of the entirety of the package 11.

Third Modification of Fourth Other Example of Configuration

Further, for example, in addition to the thermosetting insulation film 321 arranged substantially midway between the conductive resins 352*a* and 352*b* having different potentials to separate the conductive resins 352*a* and 352*b*, thermosetting insulation films 321A' to 321D' may be respectively provided at positions that respectively correspond to the thermosetting insulation films 321A to 321D described with reference to FIGS. 16 and 17, as illustrated in A and B of FIG. 18.

Note that the thermosetting insulation films 321A' to 321D' are respectively shorter at their ends than the thermosetting insulation films 321A to 321D, and their ends are not connected to each other near four corners of the upper surface 30*a* of the concave portion 30, that is, near four corners of the Peltier element 34.

Figure 18:
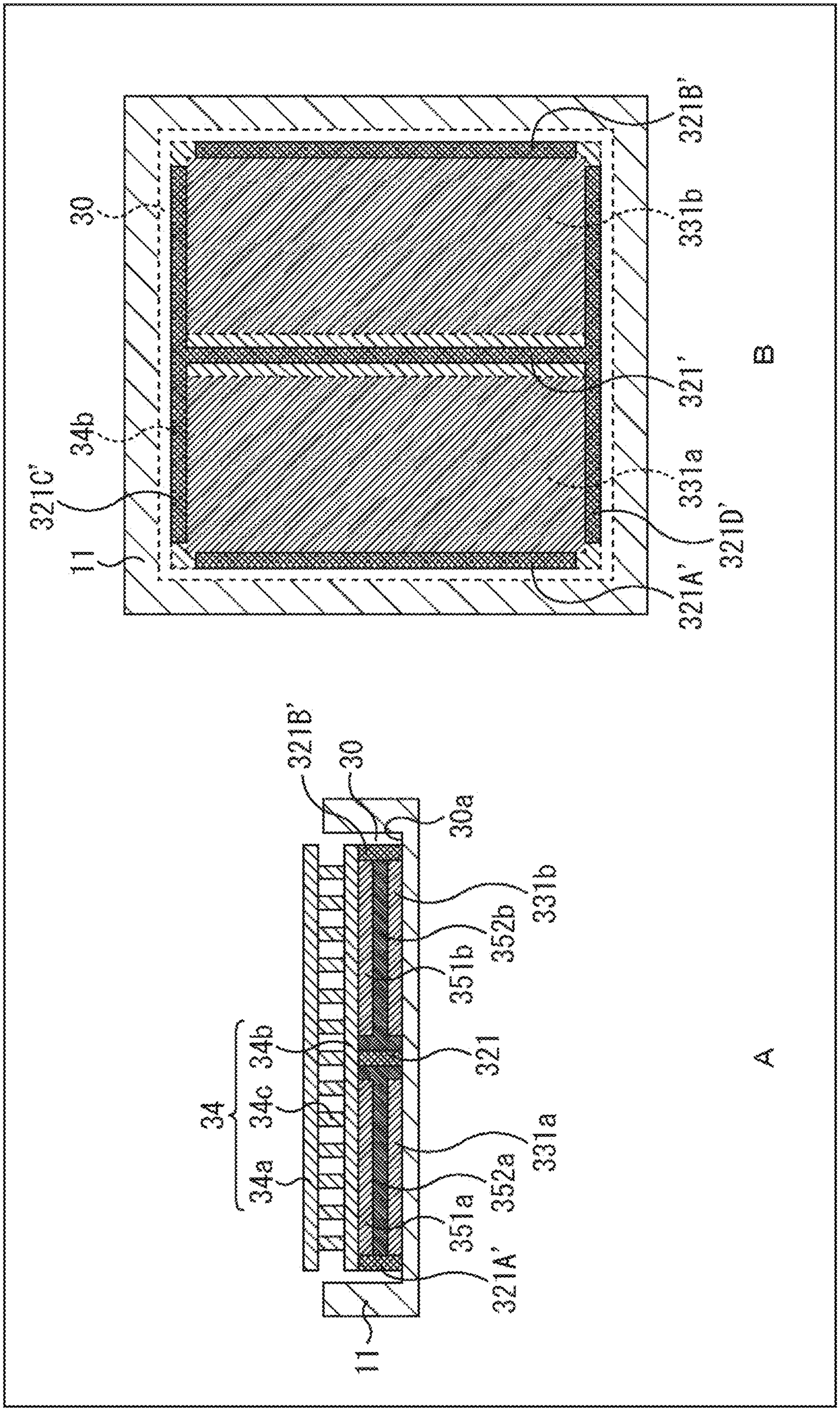
FIG. 18 is a set of an enlarged view of a cross section and a diagram illustrating a back surface according to a third modification of the fourth other configuration of the semiconductor apparatus.

Even if the conductive resin 352*a* formed between the back-surface terminal 351*a* and the upper-surface terminal 331*a* and the conductive resin 352*b* formed between the back-surface terminal 351*b* and the upper-surface terminal 331*b* respectively spill over, during the manufacturing processes, beyond ends of the back-surface terminal 351*a* and the upper-surface terminal 331*a* and beyond ends of the back-surface terminal 351*b* and the upper-surface terminal 331*b*, such a configuration will lead the conductive resins 352*a* and 352*b* in directions of the four corners of the upper surface 30*a* of the concave portion 30 in B of FIG. 18, that is, in directions of the four corners of the Peltier element 34.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward. Further, this makes it possible to expand a heat transport path that releases, to the heat sink 191, heat generated by the semiconductor apparatus 10, and thus to improve a cooling capability of the entirety of the package 11.

Fourth Modification of Fourth Other Example of Configuration

The example in which the thermosetting insulation film 321 is arranged substantially midway between the conductive resins 352*a* and 352*b* having different potentials to separate the conductive resins 352*a* and 352*b* has been described above. The thermosetting insulation film 321 is just a heat transport path that releases, to the heat sink 191, heat generated by the semiconductor apparatus 10. Thus, the efficiency in heat release can be more improved if the thermosetting insulation film 321 is made of a more thermally conductive material.

Figure 19:
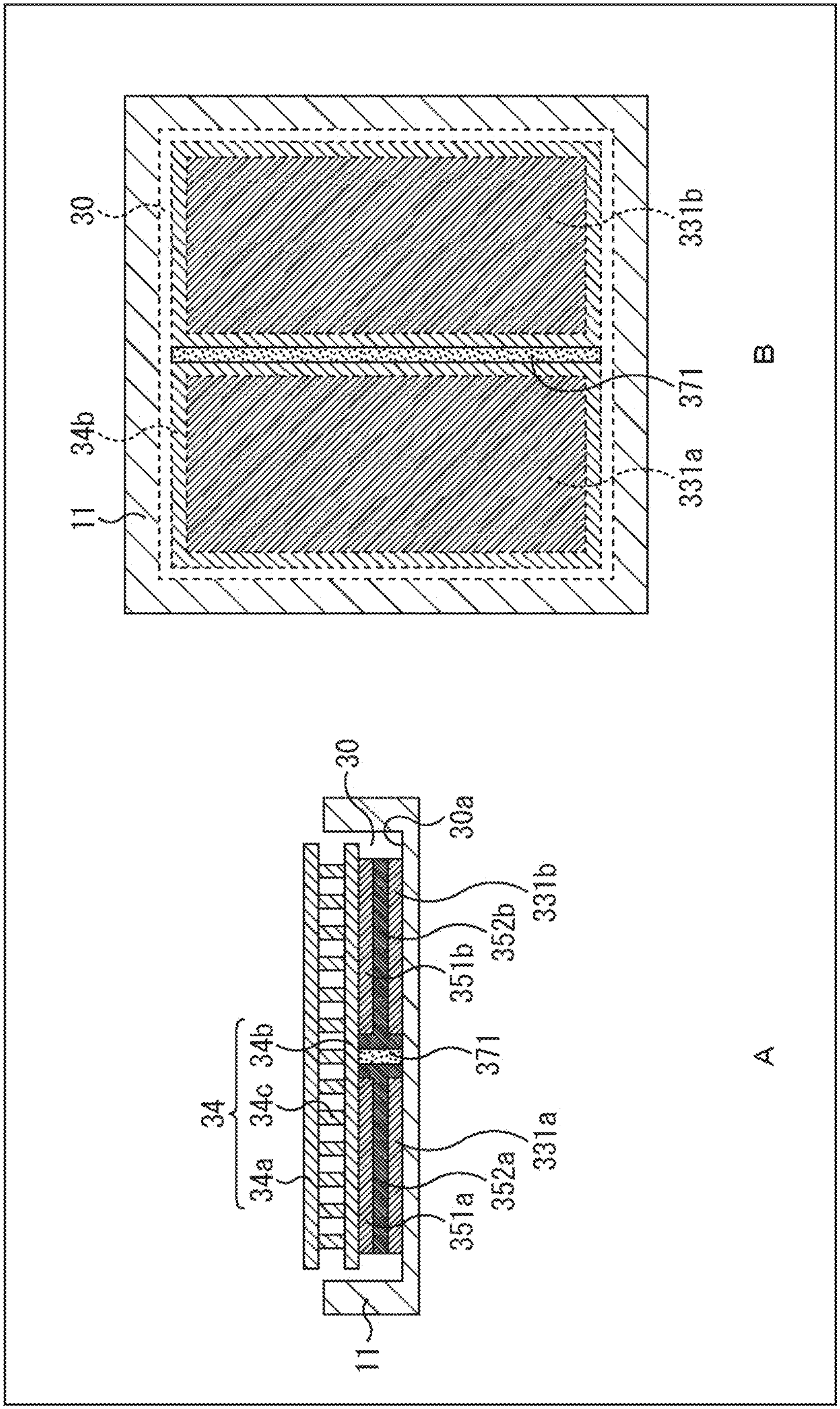
FIG. 19 is a set of an enlarged view of a cross section and a diagram illustrating a back surface according to a fourth modification of the fourth other configuration of the semiconductor apparatus.

For example, instead of the thermosetting insulation film 321, a thermosetting insulation film 371 that contains highly thermally conductive particles that are more thermally conductive than highly thermally conductive particles contained in the thermosetting insulation film 321, may be arranged substantially midway between the conductive resins 352*a* and 352*b* having different potentials to separate the conductive resins 352*a* and 352*b*, as illustrated in A and B of FIG. 19, in order to increase the thermal conductivity of the thermosetting insulation film 321.

Note that the thermosetting insulation films 321, 321', 321A to 321D, and 321A' to 321D' illustrated in FIGS. 15 to 18 may be made of the same material as the thermosetting insulation film 371 containing highly thermally conductive particles that are more thermally conductive than highly thermally conductive particles contained in the thermosetting insulation film 321.

Favorably, the highly thermally conductive particle may be a conductive particle having a thermal conductivity of, for example, 1 W/mK or more. Further, the highly thermally conductive particle favorably has a diameter that secures a bonding gap, and has a diameter of, for example, 0.1 mm or less.

This makes it possible to prevent a short circuit from being caused between the conductive resins 352*a* and 352*b*, and to improve the efficiency in heat release performed by a heat transport path that releases, to the heat sink 191, heat generated by the semiconductor apparatus 10. This makes it possible to further improve a cooling capability of the entirety of the package 11.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward. Further, this makes it possible to expand a heat transport path that releases, to the heat sink 191, heat generated by the semiconductor apparatus 10, and thus to improve a cooling capability of the entirety of the package 11.

Fifth Other Example of Configuration Between Peltier Element and Package

The example in which the thermosetting insulation film 321 is arranged substantially midway between the conductive resins 352*a* and 352*b* having different potentials to separate the conductive resins 352*a* and 352*b* has been described above. When amounts of the conductive resins 352*a* and 352*b* are large, the conductive resin 352*a* and the conductive resin 352*b* may respectively spill over beyond the ends of the back-surface terminal 351*a* and the upper-surface terminal 331*a* and beyond the ends of the back-surface terminal 351*b* and the upper-surface terminal 331*b*, and then a short circuit may be caused between the pole portion 34*c* of the Peltier element 34 and the conductive resin 352*a* or the conductive resin 352*b* due to the conductive resin 352*a* or the conductive resin 352*b* extending upward.

Thus, a trench into which the conductive resins 352*a* and 352*b* that may extend upward escape, may be formed in an outer peripheral portion on the upper surface 30*a* of the concave portion 30 of the package 11.

Figure 20:
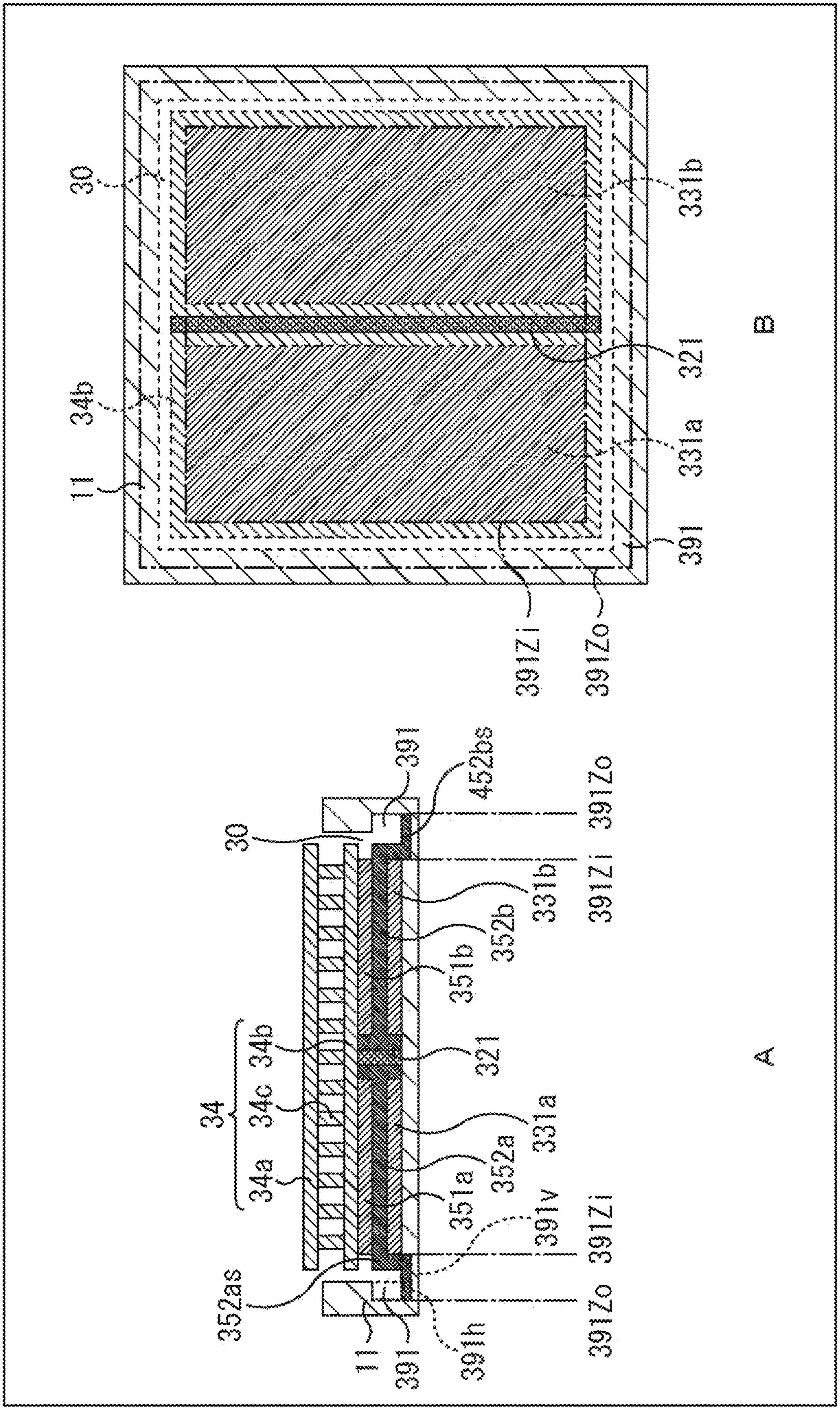
FIG. 20 is a set of an enlarged view of a cross section and a diagram illustrating a back surface according to a fifth other example of the configuration of a semiconductor apparatus.

A of FIG. 20 is an enlarged view of a rectangle, in the semiconductor apparatus 10, that corresponds to the rectangle P illustrated in FIG. 3, and B of FIG. 20 illustrates the rectangle as viewed from the back surface of the package 11, where a trench 391 into which the conductive resins 352*a* and 352*b* that may extend upward escape, is formed in the outer peripheral portion on the upper surface 30*a* of the concave portion 30 of the package 11.

The trench 391 is like a ditch formed to surround the outer peripheral portion on the upper surface 30*a* of the concave portion 30 of the package 11, and is formed by a longitudinal groove 391*v* and a transverse groove 391*h*, as illustrated on the left in A of FIG. 20.

In other words, the longitudinal groove 391*v* is a ditch formed in the upper surface 30*a* in a direction of the heat sink 191 along the outer peripheral portion on the upper surface 30*a*, and the transverse groove 391*h* is a ditch formed in a direction of an outer periphery of the upper surface 30*a*.

Such a configuration results in forming the trench 391 in a region that is formed by an inner sidewall 391Zi and an outer sidewall 391Zo and indicated by a dot-dash line illustrated in B of FIG. 20.

Even if the conductive resins 352*a* and 352*b* respectively spill over beyond the upper-surface terminals 331*a* and 331*b* and at least one of a spillover portion 352*as* of the conductive resin or a spillover portion 352*bs* of the conductive resin is generated, such a trench 391 will enable the at least one of the spillover portion 352*as* or the spillover portion 352*bs* to escape into the trench 391, as illustrated in A of FIG. 20. This makes it possible to prevent a short circuit from being caused between the pole portion 34*c* of the Peltier element 34 and at least one of the conductive resin 352*a* or the conductive resin 352*b*.

This makes it possible to prevent a short circuit from being caused between the conductive resins 352*a* and 352*b*, and to prevent a short circuit from being caused between the upper and lower substrates 34*a* and 34*b* of the Peltier element 34, and each of the conductive resins 352*a* and 352*b* due to the conductive resins 352*a* and 352*b* each extending upward.

This makes it possible to prevent a short circuit from being caused between the conductive resins 352*a* and 352*b*, and to prevent a short circuit from being caused between the pole portion 34*c* of the Peltier element 34 and at least one of the conductive resin 352*a* or the conductive resin 352*b*. The areas of the upper-surface terminals 331*a* and 331*b* and the back-surface terminals 351*a* and 351*b* are made larger, and this makes it possible to improve the efficiency in heat release performed by a heat transport path that releases, to the heat sink 191, heat generated by the semiconductor apparatus 10. This makes it possible to further improve a cooling capability of the entirety of the package 11.

Modifications of Fifth Other Example of Configuration Between Peltier Element and Package The example in which the trench 391 is formed to surround the outer peripheral portion on the upper surface 30*a* of the concave portion 30 of the package 11 and this results in preventing a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward, has been described above. However, similar effects can be provided by forming the trench at any position in the outer peripheral portion on the upper surface 30*a*.

First Modification of Fifth Other Example of Configuration

Figure 21:
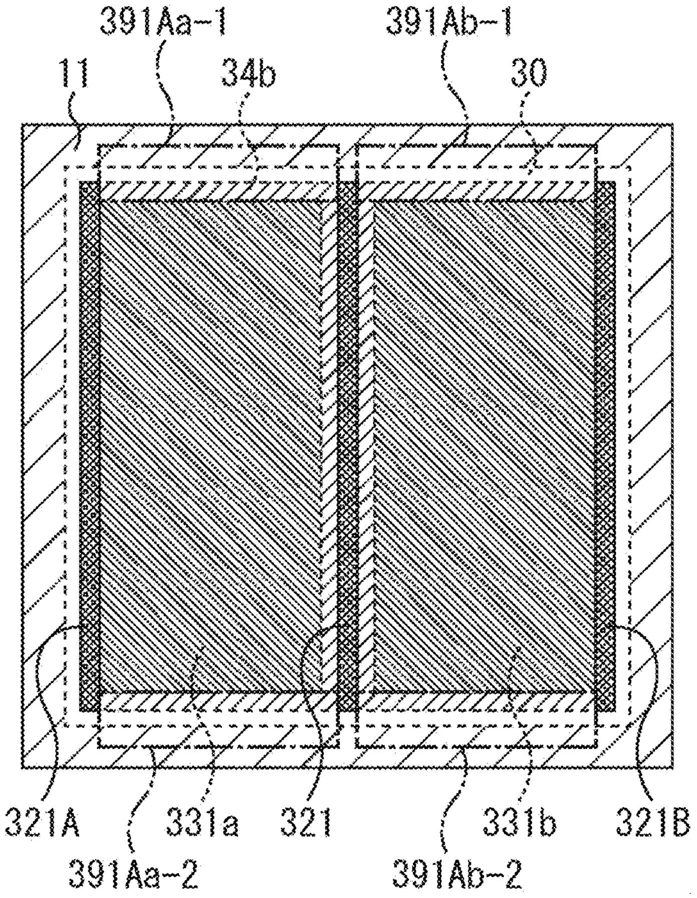
FIG. 21 is a set of an enlarged view of a cross section and a diagram illustrating a back surface according to a first modification of the fifth other configuration of the semiconductor apparatus.

For example, instead of the trench 391, trenches 391Aa-1 and 391Aa-2 and trenches 391Ab-1 and 391Ab-2 may be provided to the configuration of the package 11 illustrated in FIG. 16, as illustrated in FIG. 21.

The trenches 391Aa-1 and 391Aa-2 illustrated in FIG. 21 are respectively provided to ends of the upper-surface terminal 331*a* that are respectively situated on the upper side and on the lower side in the figure.

The trenches 391Ab-1 and 391Ab-2 illustrated in FIG. 21 are respectively provided to ends of the upper-surface terminal 331*b* that are respectively situated on the upper side and on the lower side in the figure.

Such a configuration also makes it possible to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward.

Second Modification of Fifth Other Example of Configuration

Figure 22:
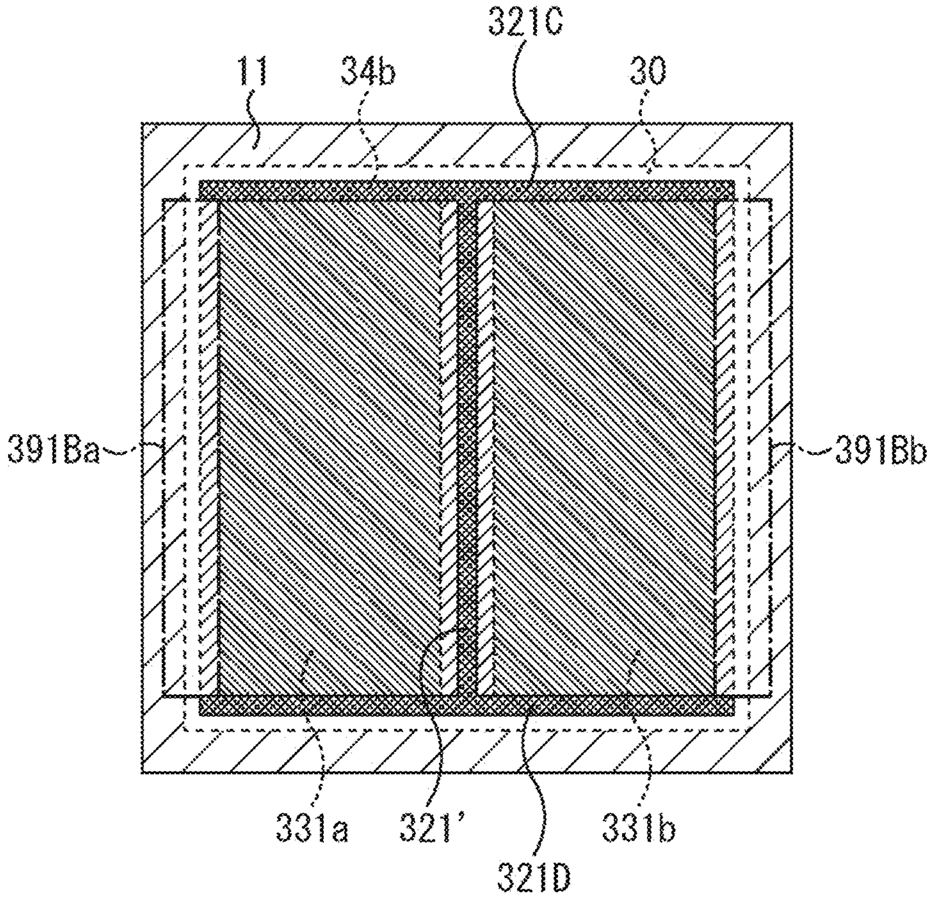
FIG. 22 is a set of an enlarged view of a cross section and a diagram illustrating a back surface according to a second modification of the fifth other configuration of the semiconductor apparatus.

Further, for example, instead of the trench 391, trenches 391Ba and 391Bb may be provided to the configuration of the package 11 illustrated in FIG. 17, as illustrated in FIG. 22.

The trench 391Ba illustrated in FIG. 22 is provided to an end of the upper-surface terminal 331*a* that is situated on the left in the figure.

The trench 391Bb illustrated in FIG. 22 is provided to an end of the upper-surface terminal 331*b* that is situated on the right in the figure.

Such a configuration also makes it possible to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward.

Third Modification of Fifth Other Example of Configuration

Figure 23:
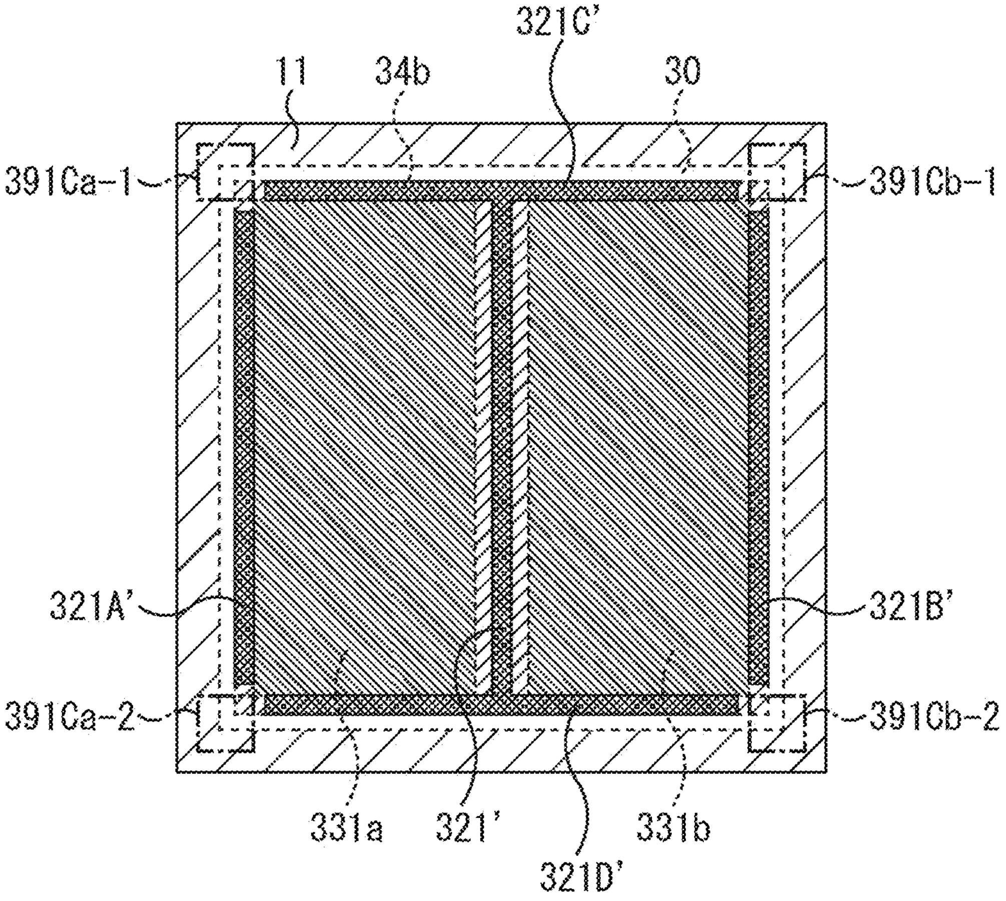
FIG. 23 is a set of an enlarged view of a cross section and a diagram illustrating a back surface according to a third modification of the fifth other configuration of the semiconductor apparatus.

Further, for example, instead of the trench 391, trenches 391Ca-1 and 391Ca-2 and trenches 391Cb-1 and 391Cb-2 may be provided to the configuration of the package 11 illustrated in FIG. 18, as illustrated in FIG. 23.

The trenches 391Ca-1 and 391Ca-2 illustrated in FIG. 23 are respectively provided to ends of the upper-surface terminal 331*a* that are respectively situated on the upper left and on the lower left in the figure.

The trenches 391Cb-1 and 391Cb-2 illustrated in FIG. 23 are respectively provided to ends of the upper-surface terminal 331*b* that are respectively situated on the upper right and on the lower right in the figure.

Such a configuration also makes it possible to prevent a short circuit from being caused between the pole portion 34*c* of the Peltier element 34 and at least one of the conductive resin 352*a* or the conductive resin 352*b* due to the at least one of the conductive resin 352*a* or the conductive resin 352*b* extending upward.

Note that the thermosetting insulation films 321, 321', 321A to 321D, and 321A' to 321D' illustrated in FIGS. 21 to 23 may also be made of the same material as the thermosetting insulation film 371 illustrated in FIG. 19.

Another Example of Connection Between Back-Surface Terminal and Pole Portion of Peltier Element In the semiconductor apparatus 10 described above, the back-surface terminal 52*b* and the one end 85 (the other end) of the pole portion 34*c* of the Peltier element 34 are connected to each other through the via 81*b* (the via 81*a*) passing through the lower substrate 34*b*. However, the back-surface terminal 52*b* and the one end 85 (the other end) of the pole portion 34*c* of the Peltier element 34 may be connected to each other through wiring that is situated on a lateral surface of the lower substrate.

Figure 24:
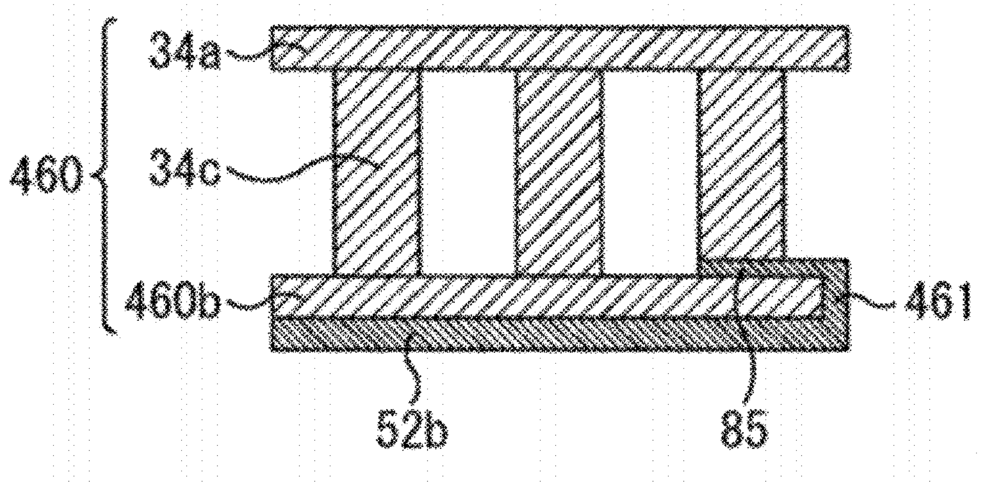
FIG. 24 is a cross-sectional view of another example of a Peltier element.

FIG. 24 is a cross-sectional view of a Peltier element of a semiconductor apparatus in this case, the cross-sectional view corresponding to the cross-sectional view along the line a-a illustrated in FIG. 5.

A certain portion, in a Peltier element 460 illustrated in FIG. 24, that corresponds to a certain portion in the Peltier element 34 illustrated in FIG. 6 is denoted by the same reference numeral as the certain portion in the Peltier element 34 illustrated in FIG. 6. Thus, a detailed description thereof is omitted as appropriate, and the description is made focused on another portion, in the Peltier element 460, that is different from another portion in the Peltier element 34.

The Peltier element 460 illustrated in FIG. 24 is different from the Peltier element 34 in including a lower substrate 460*b* instead of the lower substrate 34*b* and in including wiring 461 instead of the via 81*b*. Regarding the other points, the Peltier element 460 illustrated in FIG. 24 has a configuration similar to the configuration of the Peltier element 34.

The Peltier element 460 illustrated in FIG. 24 is not provided with the via 81*b* passing through the lower substrate 460*b*, but is provided with the wiring 461 on a right surface of the lower substrate 460*b*. The one end 85 of the pole portion 34*c* of the Peltier element 460 and the back-surface terminal 52*b* are electrically continuous with each other through the wiring 461. Likewise, the back-surface terminal 52*a* is also not provided with the via 81*b* passing through the lower substrate 460*b*, but is provided with wiring on a left surface of the lower substrate 460*b*. The other end of the pole portion 34*c* of the Peltier element 460 and the back-surface terminal 52*a* are electrically continuous with each other through this wiring.

Even when the back-surface terminal 52*b* and the one end 85 (the other end) of the pole portion 34*c* are connected to each other through the wiring 461 situated on the right surface (the wiring situated on the left surface) of the lower substrate 460*b*, as described above, the wiring 461 situated on the right surface (the wiring situated on the left surface) and the via 91*b* (91*a*) are arranged such that a route between the one end 85 (the other end) of the pole portion 34*c* and an external terminal is shortest without the electrical properties being blocked, as in the case in which the back-surface terminal 52*b* and the one end 85 (the other end) of the pole portion 34*c* are connected to each other through the via 81*b* (the via 81*a*) described with reference to FIG. 8. This makes it possible to reduce the resistance between the one end 85 (the other end) of the pole portion 34*c* and the external terminal.

Another Example of Relationship in Length-and-Width Size Between Peltier Element and Sensor Chip In the semiconductor apparatus 10 described above, the arrangement surface of the Peltier element 34 has a smaller length-and-width size than the arrangement surface of the sensor chip 35. However, the arrangement surface of the Peltier element 34 may have a larger length-and-width size than the arrangement surface of the sensor chip 35.

Figure 25:
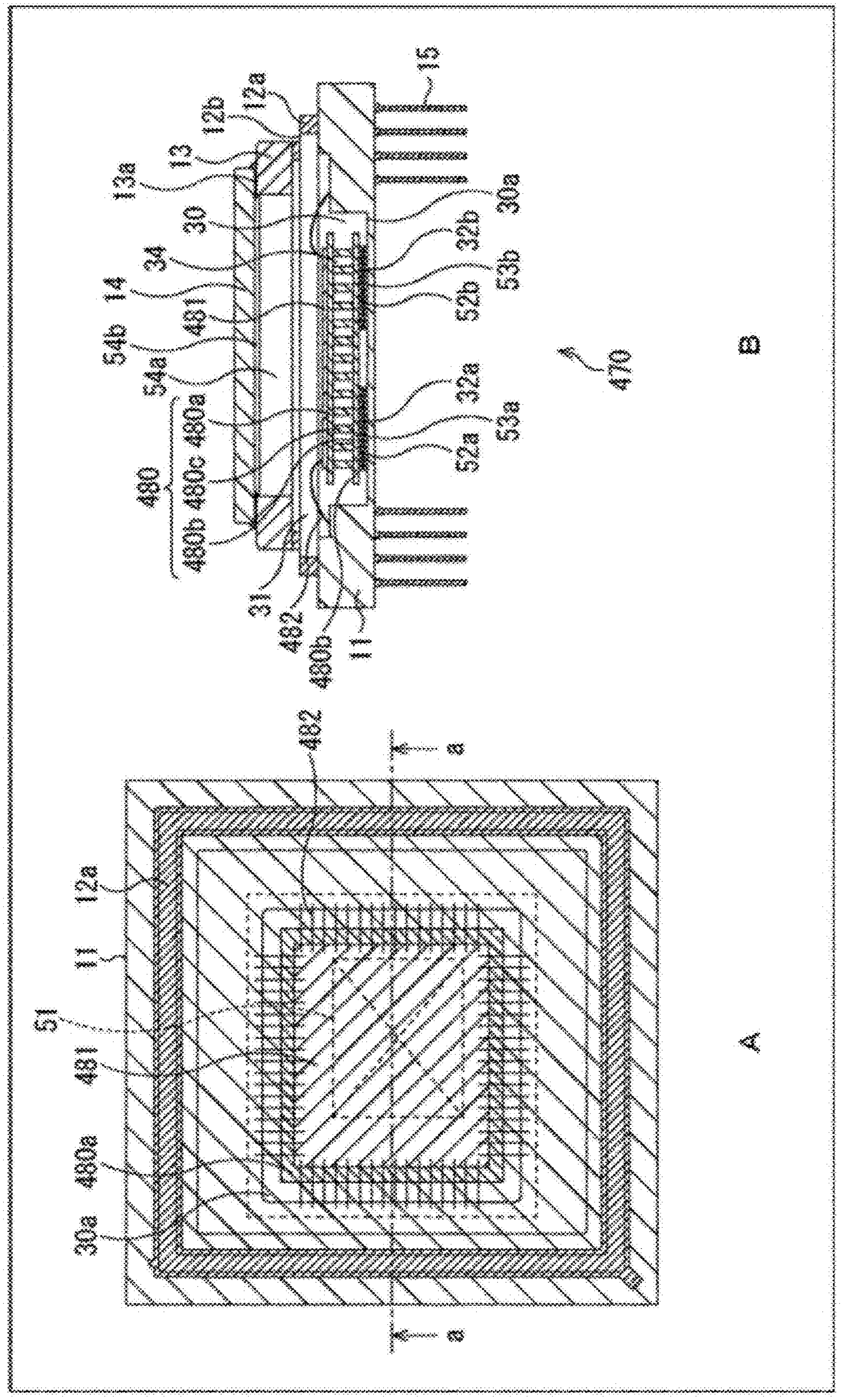
FIG. 25 is a set of a top view and a cross-sectional view of yet another example of a semiconductor apparatus.

A of FIG. 25 is a top view of a semiconductor apparatus in this case as viewed from above, and B of FIG. 25 is a cross-sectional view along the line a-a illustrated in A of FIG. 25. Note that, in A of FIG. 25, a portion that is situated above the metallic ring 12*a* is not illustrated in order to make the interior of the semiconductor apparatus more visible.

A certain portion, in a semiconductor apparatus 470 illustrated in FIG. 25, that corresponds to a certain portion in the semiconductor apparatus 10 illustrated in FIG. 3 is denoted by the same reference numeral as the certain portion in the semiconductor apparatus 10 illustrated in FIG. 3. Thus, a detailed description thereof is omitted as appropriate, and the description is made focused on another portion, in the semiconductor apparatus 470 illustrated in FIG. 25, that is different from another portion in the semiconductor apparatus 10 illustrated in FIG. 3.

The semiconductor apparatus 470 illustrated in FIG. 25 is different from the semiconductor apparatus 10 in including a Peltier element 480, a sensor chip 481, and a wire 482 instead of the Peltier element 34, the sensor chip 35, and the wire 50. Regarding the other points, the semiconductor apparatus 470 illustrated in FIG. 25 has a configuration similar to the configuration of the semiconductor apparatus 10.

In the semiconductor apparatus 470, an arrangement surface of the Peltier element 480 has a larger length-and-width size than an arrangement surface of the sensor chip 481. In this case, more excellent heat releasing properties can be obtained.

As in the case of the Peltier element 34, the Peltier element 480 is formed by a pole portion 480*c* being arranged between an upper substrate 480*a* and a lower substrate 480*b*. The sensor chip 481 and the package 11 are electrically connected to each other through the wire 482. The arrangement surface of the sensor chip 481 has a smaller length-and-width size than the arrangement surface of the Peltier element 480. Thus, a distance from the package 11 to the sensor chip 481 is larger than a distance from the package 11 to the sensor chip 35, and the wire 482 is longer than the wire 50 illustrated in FIG. 3.

Another Example of External Terminal

In the semiconductor apparatus 10 described above, the external terminal is the pin terminal 15. However, the external terminal may be an external terminal connector.

Figure 26:
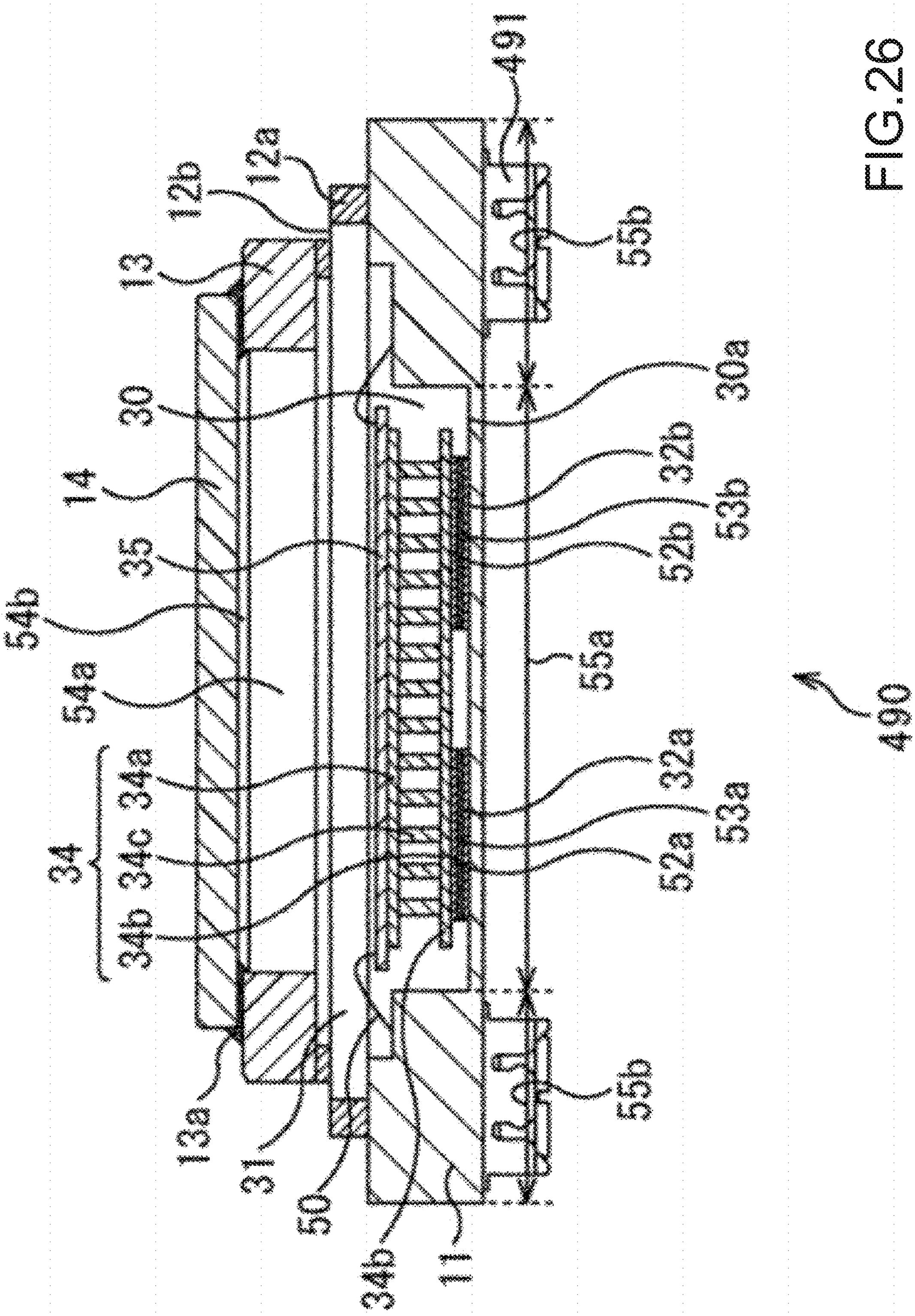
FIG. 26 is a cross-sectional view of yet another example of a semiconductor apparatus.

FIG. 26 is a cross-sectional view of a semiconductor apparatus in this case, the cross-sectional view corresponding to the cross-sectional view along the line a-a illustrated in A of FIG. 3.

A certain portion, in a semiconductor apparatus 490 illustrated in FIG. 26, that corresponds to a certain portion in the semiconductor apparatus 10 illustrated in FIG. 3 is denoted by the same reference numeral as the certain portion in the semiconductor apparatus 10 illustrated in FIG. 3. Thus, a detailed description thereof is omitted as appropriate, and the description is made focused on another portion, in the semiconductor apparatus 490 illustrated in FIG. 26, that is different from another portion in the semiconductor apparatus 10 illustrated in FIG. 3.

The semiconductor apparatus 490 illustrated in FIG. 26 is different from the semiconductor apparatus 10 in including an external terminal connector 491 instead of the pin terminal 15. Regarding the other points, the semiconductor apparatus 490 illustrated in FIG. 26 has a configuration similar to the configuration of the semiconductor apparatus 10.

In the semiconductor apparatus 490 illustrated in FIG. 26, the external terminal connector 491 is formed in the region 55*b* on the back surface of the package 11. In other words, the region being situated on the upper surface 30*a* and in which the Peltier element 34 is arranged, and the region 55*b* in which the external terminal connector 491 is formed do not overlap in the plan view. The formation of the external terminal using the external terminal connector 491 makes it possible to easily form a large number of external terminals in the region 55*b*.

In the semiconductor apparatuses described above, the upper-surface terminals 32*a* (201*a*, 221*a*) and 32*b* (201*b*, 221*b*) have the same size, but may have different sizes. The same applies to the back-surface terminals 52*a* and 52*b*.

2. Example of Application to Electronic Apparatus

The semiconductor apparatuses described above can be applied to various electronic apparatuses such as image-capturing apparatuses including digital still cameras and digital video cameras, cellular phones with image-capturing functions, and other apparatuses with image-capturing functions.

Figure 27:
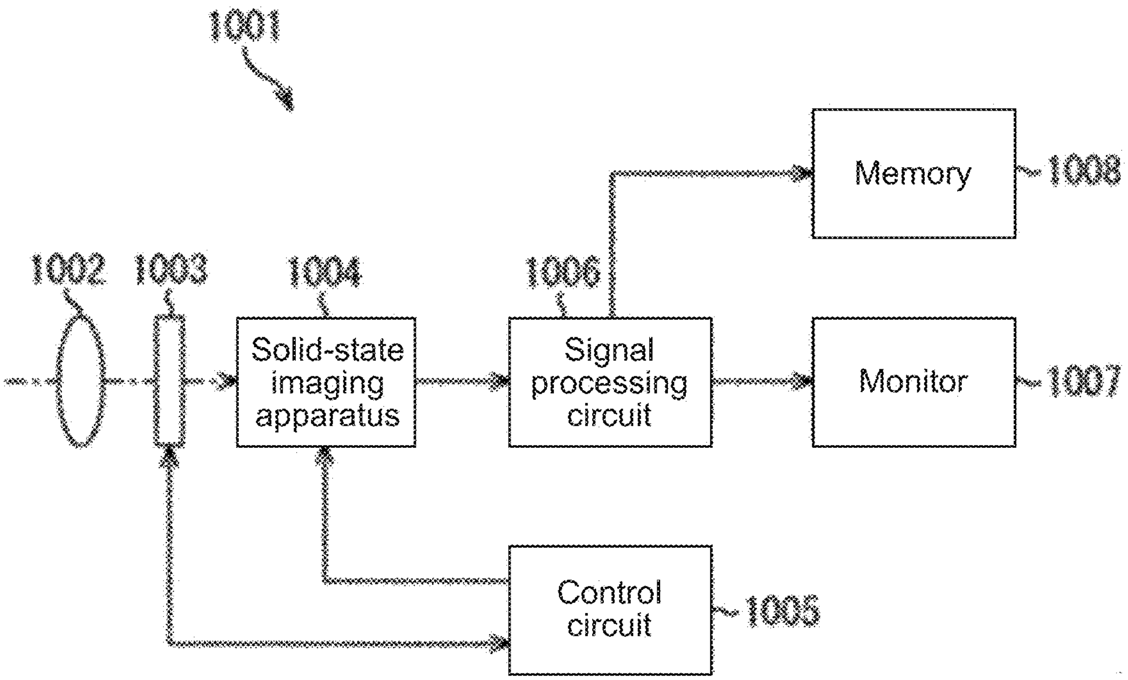
FIG. 27 is a block diagram illustrating an example of a configuration of an image-capturing apparatus that serves as an electronic apparatus to which the present technology is applied.

FIG. 27 is a block diagram illustrating an example of a configuration of an image-capturing apparatus that serves as an electronic apparatus to which the present technology is applied.

An image-capturing apparatus 1001 illustrated in FIG. 27 includes an optical system 1002, a shutter apparatus 1003, a solid-state imaging apparatus 1004, a control circuit 1005, a signal processing circuit 1006, a monitor 1007, and a memory 1008, and can capture a still image and a video.

The optical system 1002 includes at least one lens. The optical system 1002 guides, to the solid-state imaging apparatus 1004, light (incident light) coming from a subject, and focuses the light onto a light-receiving surface of the solid-state imaging apparatus 1004.

The shutter apparatus 1003 is arranged between the optical system 1002 and the solid-state imaging apparatus 1004, and controls, under the control of the control circuit 1005, a period of time for irradiating light onto the solid-state imaging apparatus 1004, and a period of time for shielding the solid-state imaging apparatus 1004 from light.

The solid-state imaging apparatus 1004 is the semiconductor apparatus described above. The solid-state imaging apparatus 1004 accumulates signal charges for a certain period of time according to light focused onto the light-receiving surface via the optical system 1002 and the shutter apparatus 1003. The signal charges accumulated in the solid-state imaging apparatus 1004 are transferred according to a drive signal (a timing signal) supplied by the control circuit 1005.

The control circuit 1005 outputs a drive signal used to control a transfer operation performed by the solid-state imaging apparatus 1004, and a shutter operation performed by the shutter apparatus 1003 to drive the solid-state imaging apparatus 1004 and the shutter apparatus 1003.

The signal processing circuit 1006 performs various signal processing on the signal charges output by the solid-state imaging apparatus 1004. An image (image data) obtained by the signal processing being performed by the signal processing circuit 1006 is supplied to be displayed on the monitor 1007, or supplied to be stored (recorded) in the memory 1008.

When the above-described semiconductor apparatus serving as the solid-state imaging apparatus 1004 is applied to the image-capturing apparatus 1001 having the configuration described above, this also makes it possible to make a sensor-chip package smaller in size, where a Peltier element is arranged in the sensor-chip package.

3. Example of How to Use Semiconductor Apparatus

Figure 28:
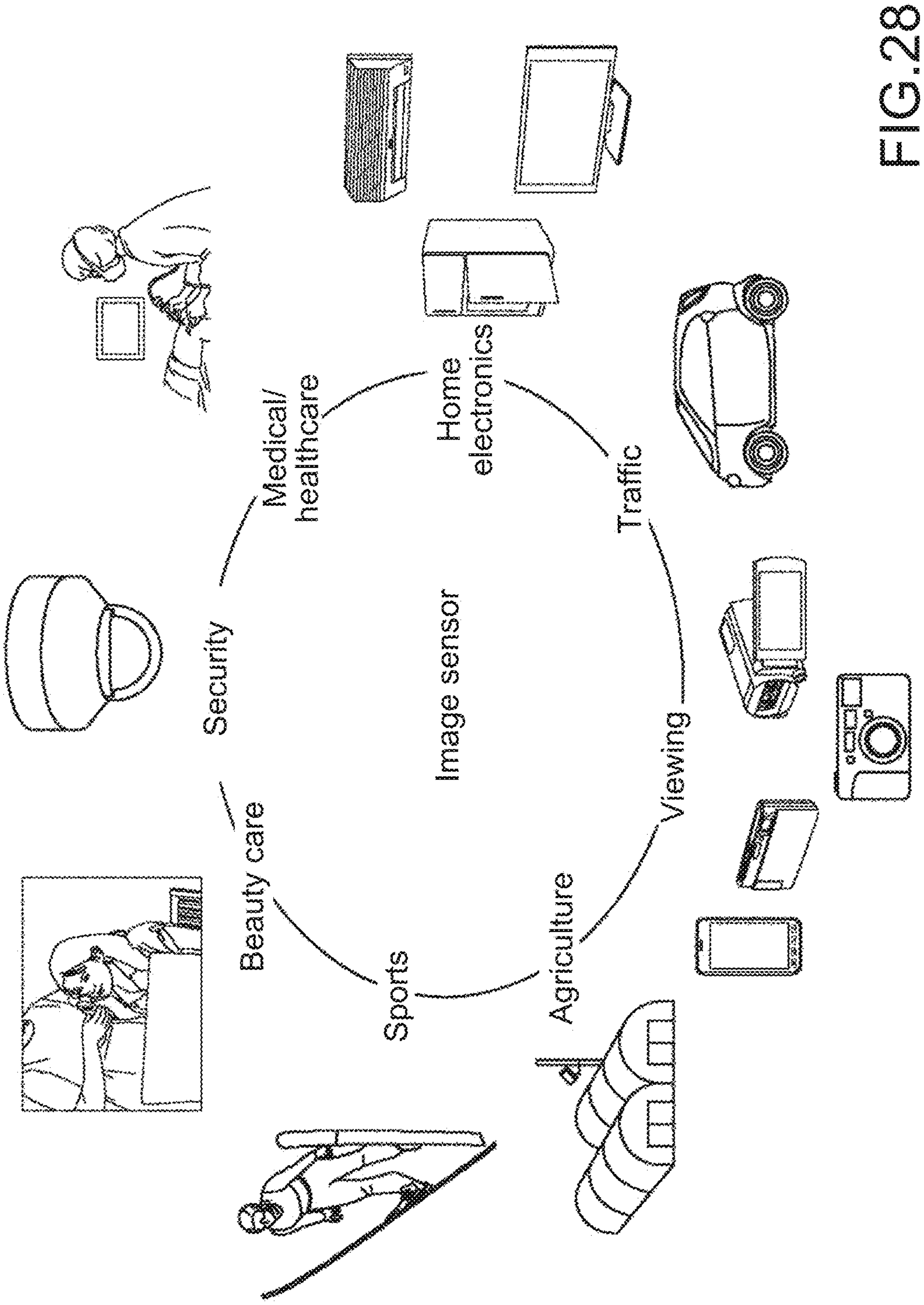
FIG. 28 is a diagram used to describe an example of how to use the semiconductor apparatuses.

FIG. 28 illustrates an example of how to use the semiconductor apparatuses described above.

For example, the semiconductor apparatus 10 described above can be used in various cases of sensing infrared light, as indicated below.

- Apparatuses used to capture an image for viewing, where examples of the apparatuses include a digital camera, and a cellular phone with a camera function.
- Apparatuses used for traffic in order to, for example, drive safely by automatic stopping or the like, and recognize a state of a driver, where examples of the apparatuses include an in-vehicle sensor that captures, for example, images of regions ahead of and behind an automobile, an image of the surroundings of the automobile, and an image of the inside of the automobile; a monitoring camera that monitors a travelling vehicle and a road; and a ranging sensor that measures a distance between vehicles.
- Apparatuses used for home electronics in order to, for example, capture an image of a gesture of a user, and perform an apparatus operation according to the gesture, where examples of the apparatuses include a TV, a refrigerator, and an air-conditioner.
- Apparatuses for medical/healthcare use, where examples of the apparatuses include an endoscope, and an apparatus that performs angiography using reception of infrared light.
- Apparatuses used for security, where examples of the apparatuses include a surveillance camera and a personal authentication camera.

- Apparatuses used for beauty care, where examples of the apparatuses include a skin measuring apparatus that captures an image of a skin, and a microscope that captures an image of a scalp.
- Apparatuses used for sports, where examples of the apparatuses include an action camera and a wearable camera that are used for sports or the like.
- Apparatuses used for agriculture, where examples of the apparatuses include a camera used to monitor a state of a farm and a crop.

4. Example of Application to Endoscopic Surgery System

The technology according to the present disclosure (the present technology) can be applied to various products. For example, the technology according to the present disclosure may be applied to an endoscopic surgery system.

Figure 29:
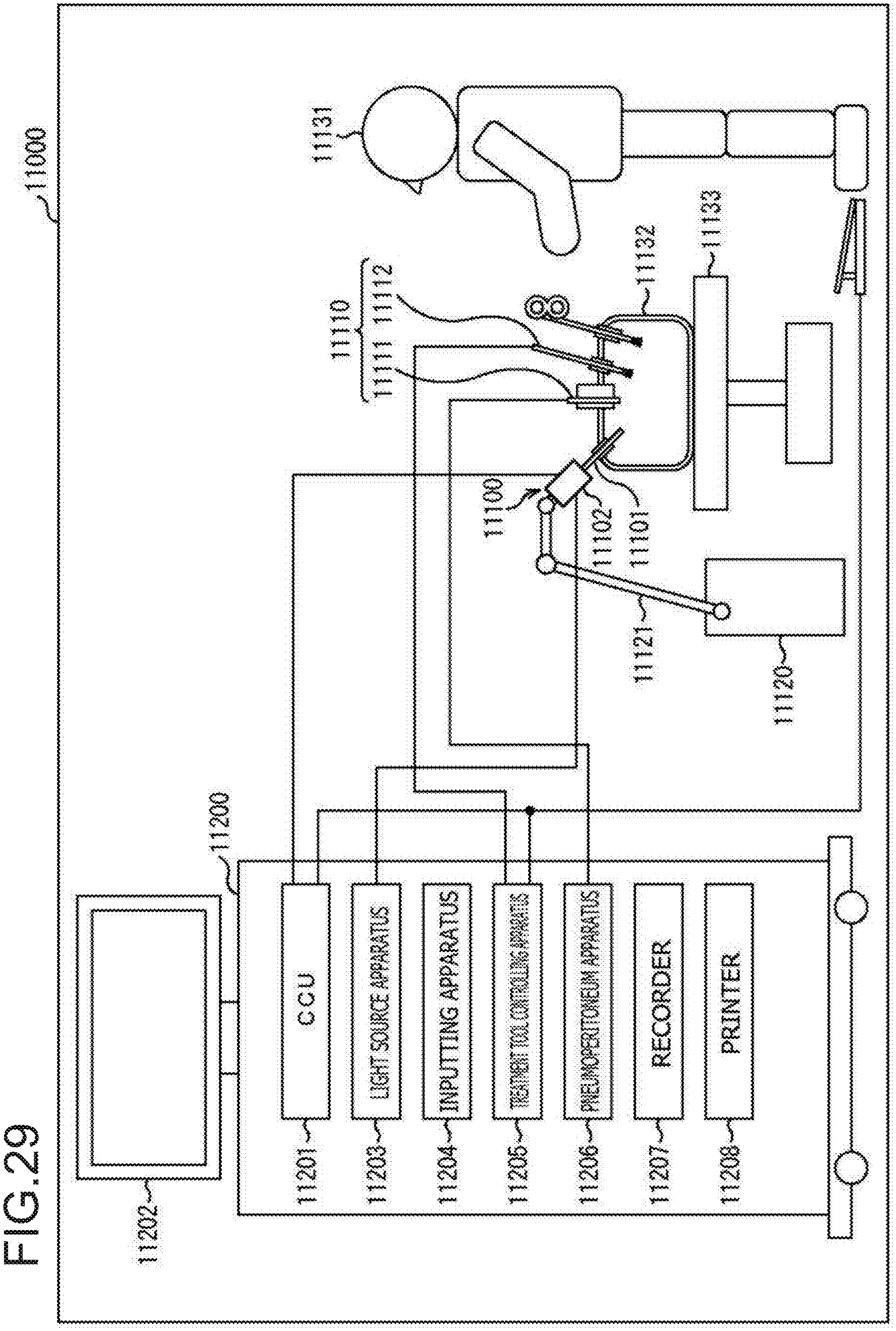
FIG. 29 is a view depicting an example of a schematic configuration of an endoscopic surgery system.

FIG. 29 is a view depicting an example of a schematic configuration of an endoscopic surgery system to which the technology according to an embodiment of the present disclosure (present technology) can be applied.

In FIG. 29, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 30:
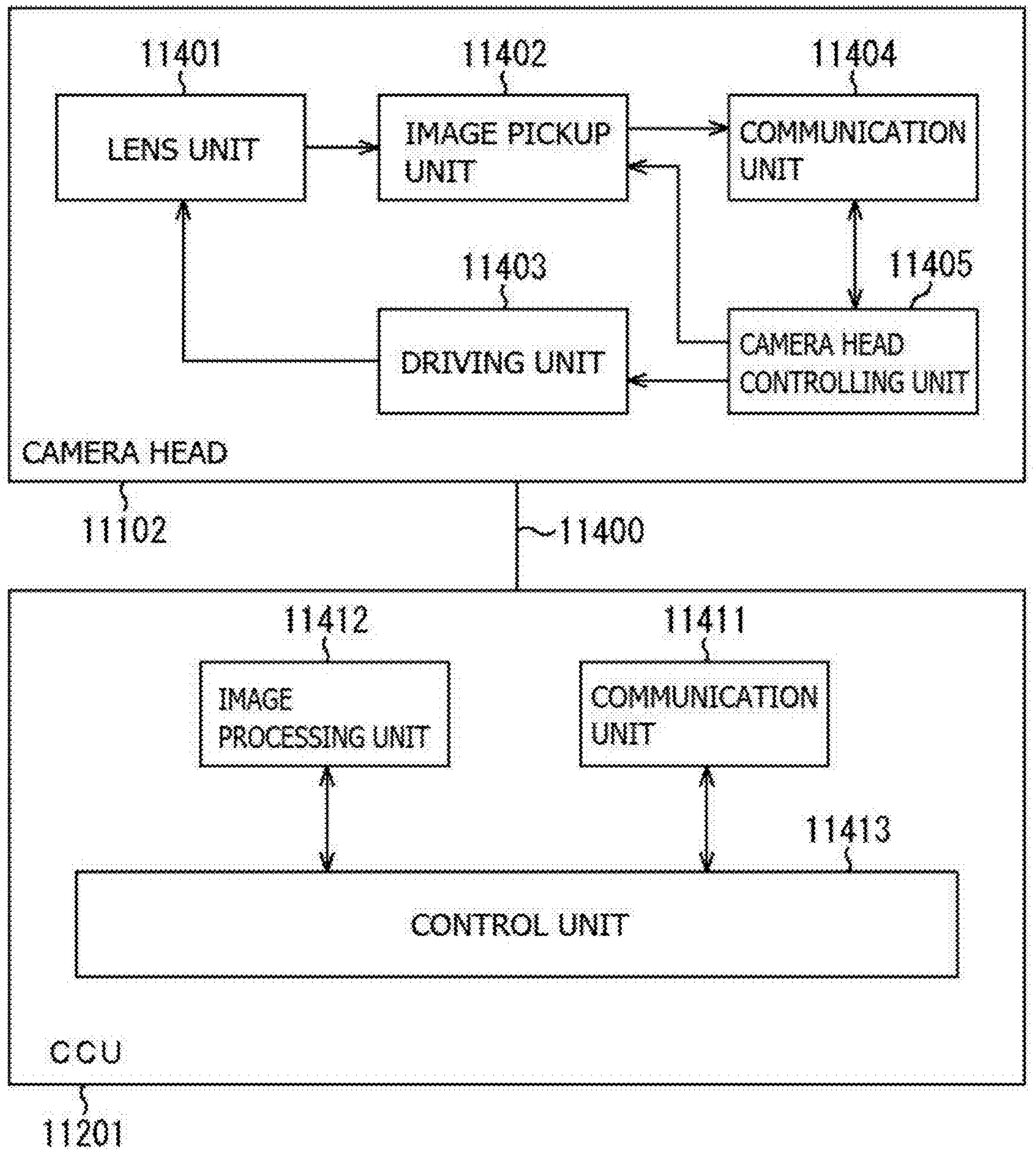
FIG. 30 is a block diagram depicting an example of a functional configuration of a camera head and a camera control unit (CCU).

FIG. 30 is a block diagram depicting an example of a functional configuration of the camera head 11102 and the CCU 11201 depicted in FIG. 29.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes the image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described above. The technology according to the present disclosure may be applied to, for example, the image pickup unit 11402 from among the structural elements described above. Application of the technology according to the present disclosure to the image pickup unit 11402 makes it possible to make a sensor-chip package smaller in size, where a Peltier element is arranged in the sensor-chip package in the image pickup unit 11402. This results in being able to make the camera head 11102 smaller in size and to acquire a highly precise image of a surgical region.

Note that the endoscopic surgery system has been described above as an example. Further, the technology according to the present disclosure may be applied to, for example, a microscopic surgery system.

5. Example of Application to Mobile Body

The technology according to the present disclosure (the present technology) can be applied to various products. For example, the technology according to the present disclosure may be provided as an apparatus that is included in one of the types of mobile bodies such as vehicle, electric vehicle, hybrid electric vehicle, motorcycle, bicycle, personal mobility, airplane, drone, ship, and robot.

Figure 31:
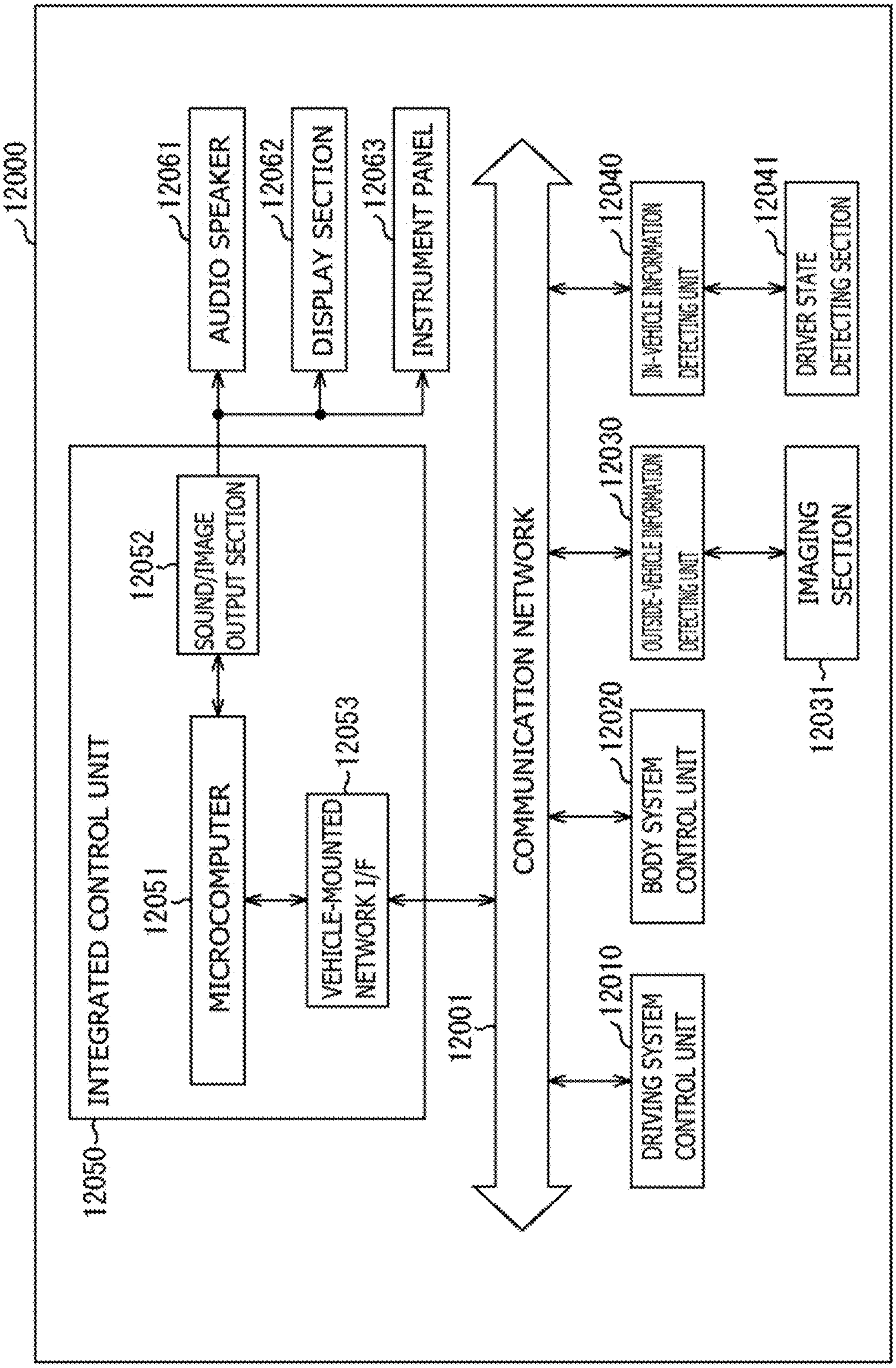
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
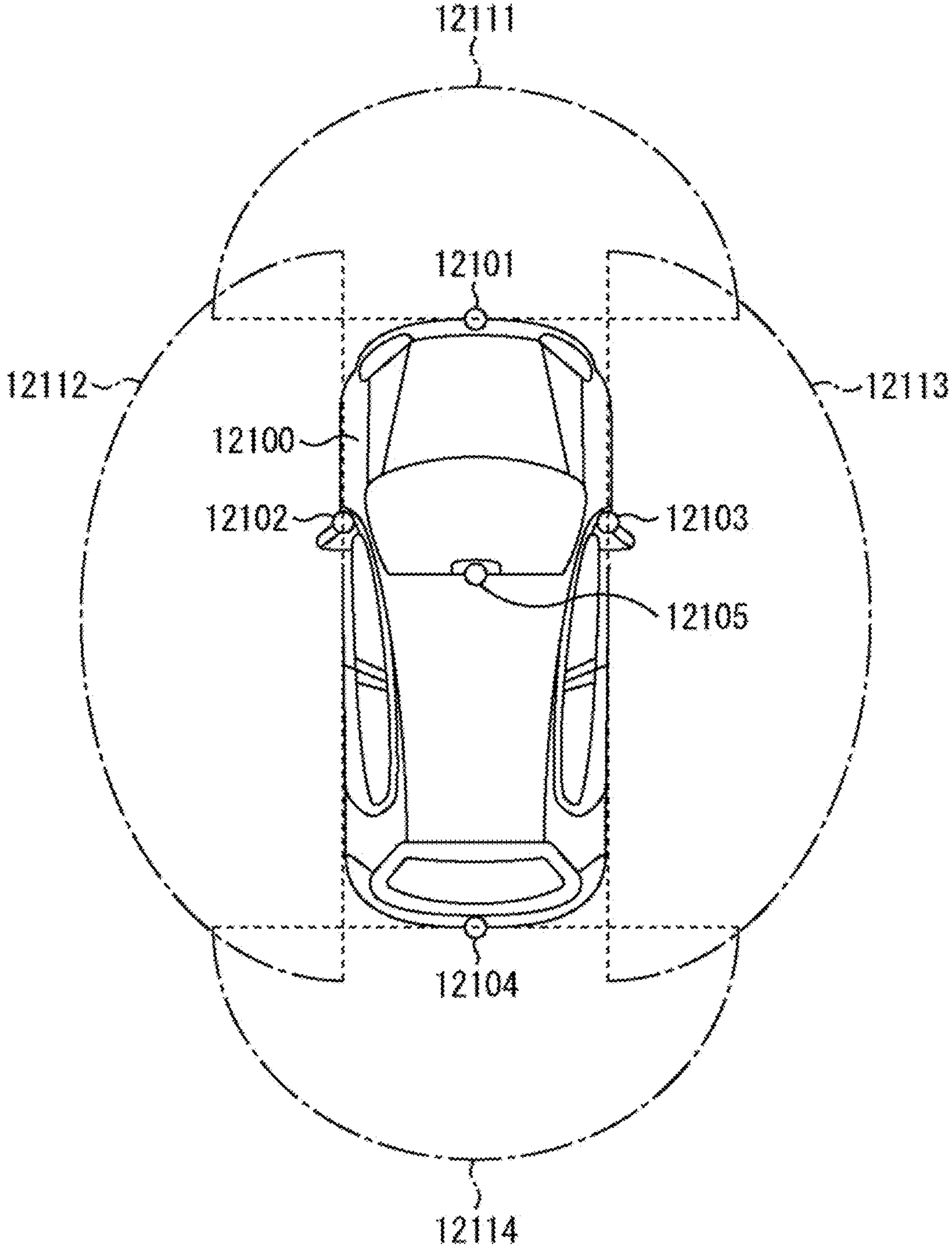
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front that are obtained by the imaging sections 12101 and 12105 are used mainly to detect a preceding vehicle, a pedestrian, an obstacle, a signal, a traffic sign, a lane, or the like.

Incidentally, FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described above. The technology according to the present disclosure may be applied to, for example, the imaging section 12031 from among the structural elements described above. Application of the technology according to the present disclosure to the imaging section 12031 makes it possible to make a sensor-chip package smaller in size, where a Peltier element is arranged in the sensor-chip package in the imaging section 12031. This results in being able to make the imaging section 12031 smaller in size and to acquire a highly precise image.

The embodiments of the present technology are not limited to the examples described above, and various modifications may be made thereto without departing from the scope of the present technology.

For example, a combination of all of, or a combination of a portion of the embodiments described above may be adopted.

Further, the effects described herein are not limitative but are merely illustrative, and an effect other than the effects described herein may be provided.

Note that the present technology may take the following configurations.

(1) A semiconductor apparatus, including:
a package that includes a concave portion;
a sensor chip that is arranged in the concave portion; and
a Peltier element that is arranged between the sensor chip and the package, in which
a back-surface terminal and an upper-surface terminal are electrically connected to each other through a conductive resin, the back-surface terminal being formed on a back surface of a lower substrate of the Peltier element, the upper-surface terminal being formed on an upper surface of the concave portion to face the back-surface terminal.

(2) The semiconductor apparatus according to (1), in which
the lower substrate of the Peltier element and the package are made of the same material.

(3) The semiconductor apparatus according to (1) or (2), in which
the conductive resin is more thermally conductive than solder.

(4) The semiconductor apparatus according to any one of (1) to (3), in which
the conductive resin has a thickness of less than or equal to 100 μm.

(5) The semiconductor apparatus according to any one of (1) to (4), in which
the back-surface terminal includes a positive terminal and a negative terminal, and
the positive terminal and negative terminal each corresponding to the back-surface terminal are situated at a specified distance from each other.

(6) The semiconductor apparatus according to (5), in which
the positive terminal and negative terminal each corresponding to the back-surface terminal are formed in the same layer.

(7) The semiconductor apparatus according to (5) or (6), in which
the positive terminal and negative terminal each corresponding to the back-surface terminal have the same size.

(8) The semiconductor apparatus according to any one of (1) to (7), in which
the upper-surface terminal includes a positive terminal and a negative terminal, and
the positive terminal and negative terminal each corresponding to the upper-surface terminal are situated at a specified distance from each other.

(9) The semiconductor apparatus according to (8), in which
the positive terminal and negative terminal each corresponding to the upper-surface terminal are formed in the same layer.

(10) The semiconductor apparatus according to (8) or (9), in which
the positive terminal and negative terminal each corresponding to the upper-surface terminal have the same size.

(11) The semiconductor apparatus according to any one of (1) to (10), in which
the upper-surface terminal situated on the upper surface is larger in size than the back-surface terminal situated on the back surface.

(12) The semiconductor apparatus according to (1), in which
the back-surface terminal includes a positive terminal and a negative terminal that are formed in the same layer,
the upper-surface terminal includes a positive terminal and a negative terminal that are formed in the same layer, and
spacing between the positive terminal and negative terminal each corresponding to the upper-surface terminal is larger than spacing between the positive terminal and negative terminal each corresponding to the back-surface terminal.

(13) The semiconductor apparatus according to (1), in which
the back-surface terminal includes a positive terminal and a negative terminal that are formed in the same layer, and
an insulator is formed between the positive terminal and negative terminal each corresponding to the upper-surface terminal.

(14) The semiconductor apparatus according to any one of (1) to (13), in which
the lower substrate of the Peltier element includes a first via that passes through the lower substrate of the Peltier element and through which the Peltier element and the back-surface terminal are electrically continuous with each other, and
the package includes a second via that is a via through which the upper-surface and an external terminal are electrically connected to each other.

(15) The semiconductor apparatus according to (14), in which
the first via and the second via are arranged such that a route between the Peltier element and the external terminal is shortest.

(16) The semiconductor apparatus according to any one of (1) to (13), in which
a lateral surface of the lower substrate of the Peltier element includes wiring through which the Peltier element and the back-surface terminal are electrically continuous with each other, and
the package includes a via through which the upper-surface terminal and an external terminal are electrically connected to each other.

(17) The semiconductor apparatus according to (16), in which
the wiring and the via are arranged such that a route between the Peltier element and the external terminal is shortest.

(18) The semiconductor apparatus according to (1), in which
the back-surface terminal includes a positive terminal and a negative terminal,
the upper-surface terminal includes a positive terminal and a negative terminal, and a partition is formed to be situated between the positive terminal and negative terminal each corresponding to the back-surface terminal, between the positive terminal and negative terminal each corresponding to the upper-surface terminal, and between the back surface of the lower substrate of the Peltier element and the upper surface of the concave portion.

(19) The semiconductor apparatus according to (18), in which the partition is insulative and thermally conductive.

(20) The semiconductor apparatus according to (19), in which the partition is formed using a thermosetting insulation film.

(21) The semiconductor apparatus according to (20), in which the thermosetting insulation film contains highly thermally conductive particles.

(22) The semiconductor apparatus according to (18), in which a first other partition and a second other partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition.

(23) The semiconductor apparatus according to (18), in which a third other partition and a fourth partition that are each different from the partition are further respectively formed at two ends of the partition in a direction orthogonal to the partition.

(24) The semiconductor apparatus according to (18), in which a first other partition, a second other partition, a third other partition, and a fourth partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the third other partition and fourth partition being respectively formed at two ends of the partition in a direction orthogonal to the partition.

(25) The semiconductor apparatus according to (18), in which a trench into which the conductive resin spilling out of a space situated between the back-surface terminal and the upper-surface terminal escapes, is further formed in an outer peripheral portion of the concave portion.

(26) The semiconductor apparatus according to (25), in which a first other partition and a second other partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the trench is formed between each of two ends of the partition and a corresponding one of two ends of the first other partition in the outer peripheral portion of the concave portion, and the trench is formed between each of the two ends of the partition and a corresponding one of two ends of the second other partition in the outer peripheral portion of the concave portion.

(27) The semiconductor apparatus according to (25), in which a third other partition and a fourth other partition that are each different from the partition are further respectively formed at two ends of the partition in a direction orthogonal to the partition, and the trench is formed between each of two ends of the third other partition and a corresponding one of two ends of the fourth other partition in the outer peripheral portion of the concave portion.

(28) The semiconductor apparatus according to (25), in which a first other partition, a second other partition, a third other partition, and a fourth other partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the third other partition and fourth other partition being respectively formed at two ends of the partition in a direction orthogonal to the partition, in the outer peripheral portion of the concave portion, the trench is formed in a square-shaped first corner that is situated near one of two ends of the first other partition and one of two ends of the third other partition, in the outer peripheral portion of the concave portion, the trench is formed in a square-shaped second corner that is situated near another of the two ends of the first other partition and one of two ends of the fourth other partition, in the outer peripheral portion of the concave portion, the trench is formed in a square-shaped third corner that is situated near one of two ends of the second other partition and another of the two ends of the third other partition, and in the outer peripheral portion of the concave portion, the trench is formed in a square-shaped fourth corner that is situated near another of the two ends of the second other partition and another of the two ends of the fourth other partition.

(29) The semiconductor apparatus according to any one of (1) to (13), in which a connector or a pin is formed in a certain region on a back surface of the package, the certain region being other than another region on the back surface of the package that faces a region on the upper surface of the package, where the Peltier element is arranged in the region on the upper surface.

(30) The semiconductor apparatus according to any one of (1) to (29), in which the sensor chip is arranged such that a center of the concave portion and a center of the sensor chip coincide.

(31) The semiconductor apparatus according to any one of (1) to (30), in which an arrangement surface of the Peltier element is smaller in size than an arrangement surface of the sensor chip.

REFERENCE SIGNS LIST

11 package
15 pin terminal
30 concave portion
30*a* upper surface
32*a*. 32*b* upper-surface terminal
34 Peltier element
34*b* lower substrate
35 sensor chip
52*a*. 52*b* back-surface terminal
53*a*. 53*b* conductive resin
81*a*. 81*b* via
91*a*. 91*b* via
172 to 174 center
201*a*. 201*b* upper-surface terminal
202*a*, 202*b* conductive resin
221*a*, 221*b* upper-surface terminal
222*a*, 222*b* conductive resin
241 convex portion
321, 321A to 321D, 321A' to 321D' thermosetting insulation film
331*a*, 331*b* upper-surface terminal
351*a*, 341*b* back-surface terminal
471 thermosetting insulation film
480 Peltier element
391, 391A, 391Aa-1, 391Aa-2, 391Ab-1, 391Ab-2, 391Ba, 391Bb, 391Ca-1, 391Ca-2, 391Cb-1, 391Cb-2
461 wiring
470 semiconductor apparatus
480*b* lower substrate
481 sensor chip
490 semiconductor apparatus
491 external terminal connector

What is claimed is:

1. A semiconductor apparatus, comprising:

a package that includes a concave portion;

a sensor chip that is arranged in the concave portion; and a Peltier element that is arranged between the sensor chip and the package, wherein a back-surface terminal and an upper-surface terminal are electrically connected to each other through a conductive resin, the back-surface terminal being formed on a back surface of a lower substrate of the Peltier element, the upper-surface terminal being formed on an upper surface of the concave portion to face the back-surface terminal.

2. The semiconductor apparatus according to claim 1, wherein the lower substrate of the Peltier element and the package are made of a same material.

3. The semiconductor apparatus according to claim 1, wherein the conductive resin is more thermally conductive than solder.

4. The semiconductor apparatus according to claim 1, wherein the conductive resin has a thickness of less than or equal to 100 μm.

5. The semiconductor apparatus according to claim 1, wherein the back-surface terminal includes a positive terminal and a negative terminal, and the positive terminal and negative terminal each corresponding to the back-surface terminal are situated at a specified distance from each other.

6. The semiconductor apparatus according to claim 5, wherein the positive terminal and negative terminal each corresponding to the back-surface terminal are formed in a same layer.

7. The semiconductor apparatus according to claim 5, wherein the positive terminal and negative terminal each corresponding to the back-surface terminal have a same size.

8. The semiconductor apparatus according to claim 1, wherein the upper-surface terminal includes a positive terminal and a negative terminal, and the positive terminal and negative terminal each corresponding to the upper-surface terminal are situated at a specified distance from each other.

9. The semiconductor apparatus according to claim 8, wherein the positive terminal and negative terminal each corresponding to the upper-surface terminal are formed in a same layer.

10. The semiconductor apparatus according to claim 8, wherein the positive terminal and negative terminal each corresponding to the upper-surface terminal have a same size.

11. The semiconductor apparatus according to claim 1, wherein the upper-surface terminal situated on the upper surface is larger in size than the back-surface terminal situated on the back surface.

12. The semiconductor apparatus according to claim 1, wherein the back-surface terminal includes a positive terminal and a negative terminal that are formed in the same layer, the upper-surface terminal includes a positive terminal and a negative terminal that are formed in a same layer, and spacing between the positive terminal and negative terminal each corresponding to the upper-surface terminal is larger than spacing between the positive terminal and negative terminal each corresponding to the back-surface terminal.

13. The semiconductor apparatus according to claim 1, wherein the back-surface terminal includes a positive terminal and a negative terminal that are formed in a same layer, and an insulator is formed between the positive terminal and negative terminal each corresponding to the upper-surface terminal.

14. The semiconductor apparatus according to claim 1, wherein the lower substrate of the Peltier element includes a first via that passes through the lower substrate of the Peltier element and through which the Peltier element and the back-surface terminal are electrically continuous with each other, and the package includes a second via that is a via through which the upper-surface and an external terminal are electrically connected to each other.

15. The semiconductor apparatus according to claim 14, wherein the first via and the second via are arranged such that a route between the Peltier element and the external terminal is shortest.

16. The semiconductor apparatus according to claim 1, wherein a lateral surface of the lower substrate of the Peltier element includes wiring through which the Peltier element and the back-surface terminal are electrically continuous with each other, and the package includes a via through which the upper-surface terminal and an external terminal are electrically connected to each other.

17. The semiconductor apparatus according to claim 16, wherein the wiring and the via are arranged such that a route between the Peltier element and the external terminal is shortest.

18. The semiconductor apparatus according to claim 1, wherein the back-surface terminal includes a positive terminal and a negative terminal, the upper-surface terminal includes a positive terminal and a negative terminal, and a partition is formed to be situated between the positive terminal and negative terminal each corresponding to the back-surface terminal, between the positive terminal and negative terminal each corresponding to the upper-surface terminal, and between the back surface of the lower substrate of the Peltier element and the upper surface of the concave portion.

19. The semiconductor apparatus according to claim 18, wherein the partition is insulative and thermally conductive.

20. The semiconductor apparatus according to claim 19, wherein the partition is formed using a thermosetting insulation film.

21. The semiconductor apparatus according to claim 20, wherein the thermosetting insulation film contains highly thermally conductive particles.

22. The semiconductor apparatus according to claim 18, wherein a first other partition and a second other partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition.

23. The semiconductor apparatus according to claim 18, wherein a third other partition and a fourth partition that are each different from the partition are further respectively formed at two ends of the partition in a direction orthogonal to the partition.

24. The semiconductor apparatus according to claim 18, wherein a first other partition, a second other partition, a third other partition, and a fourth partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the third other partition and fourth partition being respectively formed at two ends of the partition in a direction orthogonal to the partition.

25. The semiconductor apparatus according to claim 18, wherein a trench into which the conductive resin spilling out of a space situated between the back-surface terminal and the upper-surface terminal escapes, is further formed in an outer peripheral portion of the concave portion.

26. The semiconductor apparatus according to claim 25, wherein a first other partition and a second other partition that are each different from the partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the trench is formed between each of two ends of the partition and a corresponding one of two ends of the first other partition in the outer peripheral portion of the concave portion, and the trench is formed between each of the two ends of the partition and a corresponding one of two ends of the second other partition in the outer peripheral portion of the concave portion.

27. The semiconductor apparatus according to claim 25, wherein a third other partition and a fourth other partition that are each different from the partition are further respectively formed at two ends of the partition in a direction orthogonal to the partition, and the trench is formed between each of two ends of the third other partition and a corresponding one of two ends of the fourth other partition in the outer peripheral portion of the concave portion.

28. The semiconductor apparatus according to claim 25, wherein a first other partition, a second other partition, a third other partition, and a fourth other partition are further formed, the first other partition being formed to be situated across the positive terminals respectively corresponding to the back-surface terminal and the upper-surface terminal from the partition, the second other partition being formed to be situated across the negative terminals respectively corresponding to the back-surface terminal and the upper-surface terminal from the partition, the third other partition and fourth other partition being respectively formed at two ends of the partition in a direction orthogonal to the partition, in the outer peripheral portion of the concave portion, the trench is formed in a square-shaped first corner that is situated near one of two ends of the first other partition and one of two ends of the third other partition, in the outer peripheral portion of the concave portion, the trench is formed in a square-shaped second corner that is situated near another of the two ends of the first other partition and one of two ends of the fourth other partition, in the outer peripheral portion of the concave portion, the trench is formed in a square-shaped third corner that is situated near one of two ends of the second other partition and another of the two ends of the third other partition, and in the outer peripheral portion of the concave portion, the trench is formed in a square-shaped fourth corner that is situated near another of the two ends of the second other partition and another of the two ends of the fourth other partition.

29. The semiconductor apparatus according to claim 1, wherein a connector or a pin is formed in a certain region on a back surface of the package, the certain region being other than another region on the back surface of the package that faces a region on the upper surface of the package, where the Peltier element is arranged in the region on the upper surface.

30. The semiconductor apparatus according to claim 1, wherein the sensor chip is arranged such that a center of the concave portion and a center of the sensor chip coincide.

31. The semiconductor apparatus according to claim 1, wherein an arrangement surface of the Peltier element is smaller in size than an arrangement surface of the sensor chip.

* * * * *